(12) United States Patent
Wang et al.

(10) Patent No.: US 10,136,545 B2
(45) Date of Patent: Nov. 20, 2018

(54) POWER MODULE

(71) Applicant: DELTA ELECTRONICS, INC., Taoyuan (TW)

(72) Inventors: Tao Wang, Shanghai (CN); Kai Lu, Shanghai (CN); Zhenqing Zhao, Shanghai (CN); Shouyu Hong, Shanghai (CN); Wei Cheng, Shanghai (CN)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 15/486,591

(22) Filed: Apr. 13, 2017

(65) Prior Publication Data

US 2017/0339798 A1 Nov. 23, 2017

(30) Foreign Application Priority Data

May 23, 2016 (CN) .......................... 2016 1 0347970

(51) Int. Cl.
| | |
|---|---|
| H05K 7/14 | (2006.01) |
| H05K 1/18 | (2006.01) |
| H05K 5/03 | (2006.01) |
| H01L 23/04 | (2006.01) |
| H01L 25/07 | (2006.01) |

(52) U.S. Cl.
CPC .......... *H05K 7/1432* (2013.01); *H01L 23/04* (2013.01); *H01L 25/072* (2013.01); *H05K 1/181* (2013.01); *H05K 5/03* (2013.01); *H05K 7/1401* (2013.01); *H01L 2224/48091* (2013.01); *H01L 2224/48472* (2013.01); *H01L 2224/4903* (2013.01); *H01L 2224/49111* (2013.01); *H01L 2224/73265* (2013.01); *H01L 2924/181* (2013.01)

(58) Field of Classification Search
CPC ........ H05K 7/1432; H05K 1/181; H05K 5/03; H05K 7/1401
See application file for complete search history.

(56) References Cited

U.S. PATENT DOCUMENTS

| | | |
|---|---|---|
| 5,767,447 A | 6/1998 | Dudderar |
| 6,521,983 B1 | 2/2003 | Yoshimatsu |

(Continued)

FOREIGN PATENT DOCUMENTS

| | | | | |
|---|---|---|---|---|
| FR | 2820719 A1 * | 8/2002 | ......... | B65D 11/1873 |
| JP | S59079562 A | 5/1984 | | |

*Primary Examiner* — Hoa C Nguyen
*Assistant Examiner* — Keith Depew
(74) *Attorney, Agent, or Firm* — Kirton McConkie; Evan R. Witt

(57) ABSTRACT

The present invention provides a power module including a substrate and a modular housing structure. The substrate includes an electronic element disposed thereon. The modular housing structure is disposed on the substrate and located around the electronic element. The modular housing structure includes a plurality of sidewalls configured to connect with each other detachably. Each sidewall includes two connecting elements disposed on two opposite ends thereof respectively. The two connecting elements of any one of the sidewalls are connected to two corresponding connecting elements of two adjacent sidewalls respectively. Consequently, the numbers and connections of the sidewalls are adjustable and varied according to the size of the substrate so as to avoid the waste of space and enhance the power density.

17 Claims, 24 Drawing Sheets

(56) References Cited

U.S. PATENT DOCUMENTS

| | | | |
|---|---|---|---|
| 2008/0146044 A1* | 6/2008 | Liao | H05K 7/1053 |
| | | | 439/41 |
| 2008/0149387 A1* | 6/2008 | Oda | H05K 7/026 |
| | | | 174/520 |
| 2009/0104734 A1 | 4/2009 | Specht | |
| 2012/0256194 A1* | 10/2012 | Yoshihara | H01L 24/32 |
| | | | 257/77 |
| 2015/0289388 A1* | 10/2015 | Conway | H05K 5/0021 |
| | | | 312/236 |
| 2015/0289389 A1* | 10/2015 | Conway | B65D 21/0209 |
| | | | 220/4.02 |

\* cited by examiner

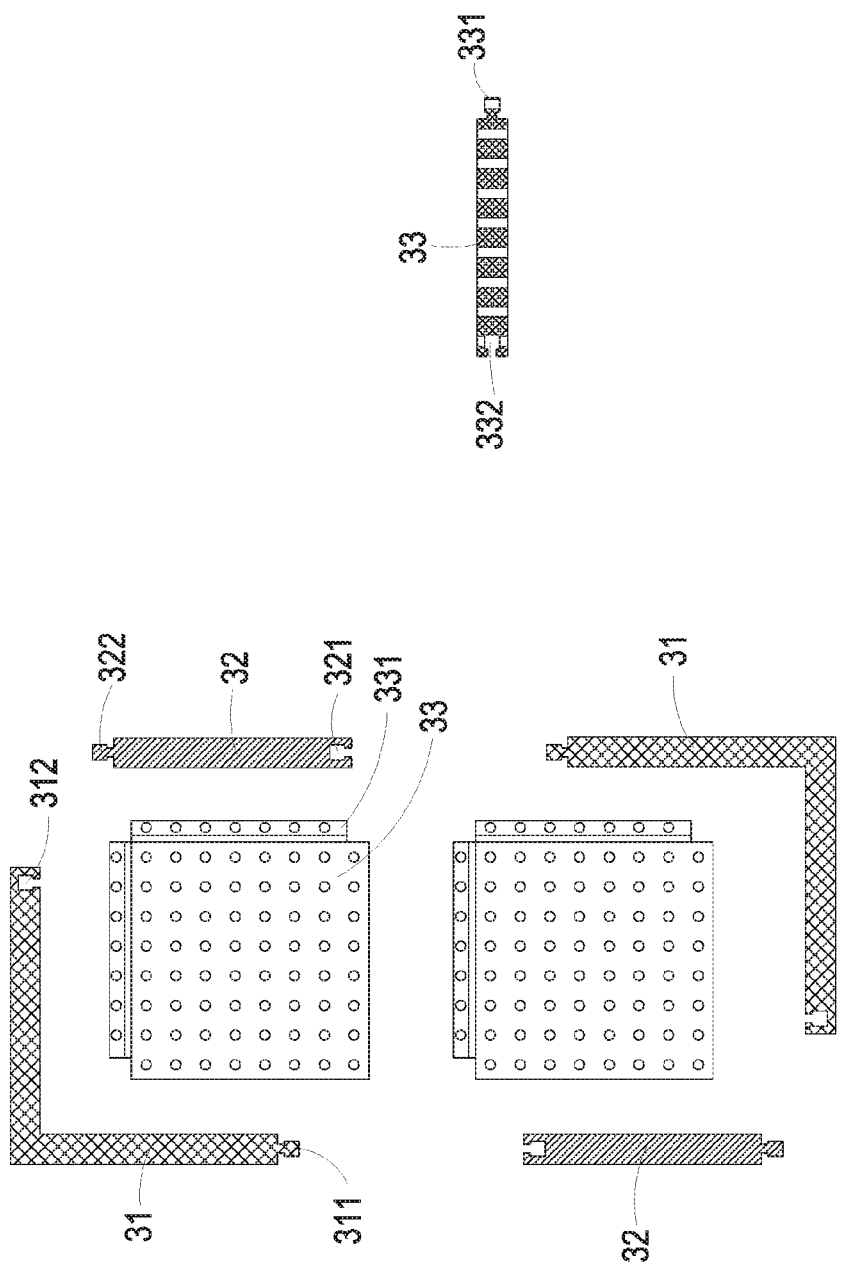

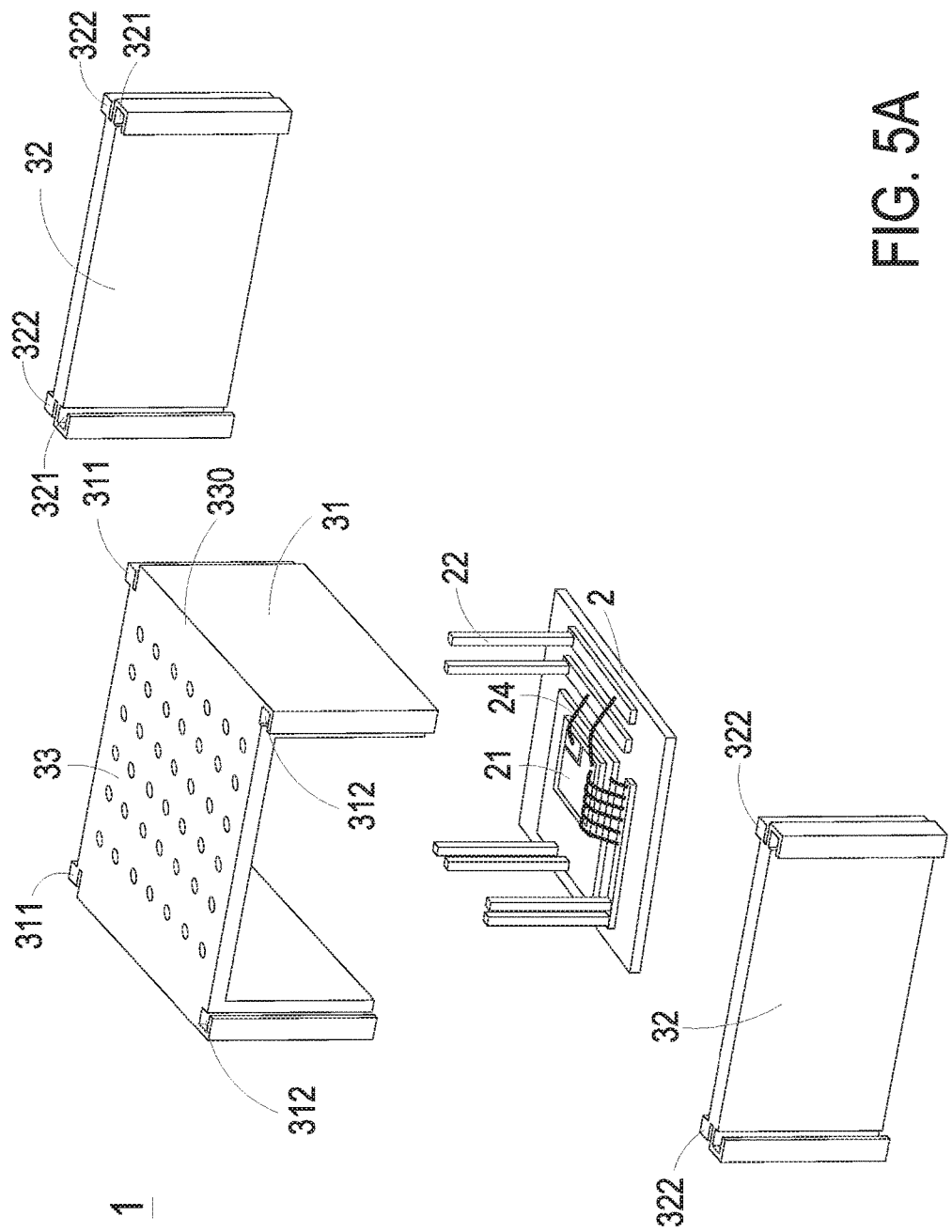

POWER MODULE
>
> ## FIELD OF THE INVENTION
>
> The present invention relates to a power module, and more particularly to a power module having a modular housing structure.
>
> ## BACKGROUND OF THE INVENTION
>
> Conventional power module generally has a substrate as the bottom portion. Taking a power module having the power substrate as the bottom portion for example, the main structure of the power module includes the power substrate, a power chip, a connecting material, a bonding wire, a compound, a sealing material, a metal terminal and an outer housing structure. The power chip is disposed on the power substrate by the connecting material so as to accomplish the mechanical support of the power chip and dissipate the heat via the power substrate. The metal terminal is also connected to the power substrate by the connecting material and the electrodes of the power chip are connected to the power substrate by the bonding wire so as to accomplish the circuit conduction. Consequently, circuit of the power module is electrically connected with the external power and signal circuit by the metal terminal. In the entire structure of the power module, the outer housing structure further provides an accommodation space with the sealed bottom portion to be filled with the compound, so that the compound provides a protective environment and a protective insulation around the power chip.
>
> In the conventional power module, the outer housing structure can be divided into two types. One is the integral forming structure and another is the multiple-parts housing structure. The integral forming housing structure includes a frame vertical to the power substrate and a cover parallel to the power substrate, wherein the frame and the cover are formed into the integral forming housing. The multiple-parts housing structure includes the frame and the cover formed separately. However, the above two types of the outer housing structures applied to the conventional power module have the fixed size and the accommodation space thereof is limited, so that accommodable power substrate is limited. If the fixed outer housing structure is used to accommodate a product with lower power level, the material of the power substrate and the compound will be wasted and the power density will be decreased. Consequently, the entire cost is increased and the power density of the system is influenced. On the other hand, in correspondence to new topology or power level, for the purposes of reducing the material cost and enhancing the power density of the system, the above two types of outer housing structures have to re-mold. Consequently, it will increase the extra cost for re-molding and the managing cost of the molding tools. The entire manufacturing cost can't be reduced.
>
> Therefore, there is a need of providing a power module having a modular housing structure to overcome the above drawbacks.
>
> ## SUMMARY OF THE INVENTION
>
> The present invention provides a power module having a modular housing structure. The modular housing structure has flexible number sidewalls configured to provide an adjustable assembly according to the size of the substrate, so as to prevent from the waste of space and to increase the power density. While developing the new topology or power level, there is no need of remolding a new outer housing structure for accommodating a larger substrate, and the space waste caused by accommodating a smaller substrate within the larger outer housing structure can be prevented. Consequently, the entire manufacturing cost can be reduced, the power density of the power module can be increased, and the product will be more competitive.
>
> The present invention provides a power module having a modular housing structure. The modular housing structure includes modular and extendable sidewalls and covers, which are configured to package different substrates with varied sizes, so as to accomplish the entire structure with optimized strength and high power density.
>
> In accordance with an aspect of the present invention, there is provided a power module including a substrate and a modular housing structure. The substrate includes an electronic element disposed thereon. The modular housing structure is disposed on the substrate and located around the electronic element. The modular housing structure includes a plurality of sidewalls configured to connect with each other detachably. Each sidewall includes two connecting elements disposed on two opposite ends thereof respectively. The two connecting elements of any one of the sidewalls are connected to two corresponding connecting elements of two adjacent sidewalls respectively.
>
> The above contents of the present invention will become more readily apparent to those ordinarily skilled in the art after reviewing the following detailed description and accompanying drawings, in which:
>
> ## BRIEF DESCRIPTION OF THE DRAWINGS
>
> FIG. 1A is an exploded view illustrating a power module according to a first preferred embodiment of the present invention;
>
> FIG. 1B is a cross sectional view illustrating the power module of FIG. 1A;
>
> FIG. 1C is a bottom view illustrating the sidewalls and the covers of FIG. 1A;
>
> FIG. 1D is a cross sectional view illustrating the cover of FIG. 1A;
>
> FIG. 2 is a bottom view illustrating a modular housing structure of a power module according to a second preferred embodiment of the present invention;
>
> FIG. 3 is a bottom view illustrating a modular housing structure of a power module according to a third preferred embodiment of the present invention;
>
> FIG. 4 is a cross sectional view illustrating a power module according to a fourth preferred embodiment of the present invention;
>
> FIG. 5A is an exploded view illustrating a power module according to a fifth preferred embodiment of the present invention;
>
> FIGS. 5B and 5C are bottom views illustrating the modular housing structure of FIG. 5A in detachment and in assembly respectively;
>
> FIG. 6 is a bottom view illustrating a modular housing structure of a power module according to a sixth preferred embodiment of the present invention;
>
> FIG. 7 is a bottom view illustrating a modular housing structure of a power module according to a seventh preferred embodiment of the present invention;
>
> FIGS. 8A and 8B are bottom views illustrating a modular housing structure in detachment and in assembly respectively according to an eighth preferred embodiment of the present invention;

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
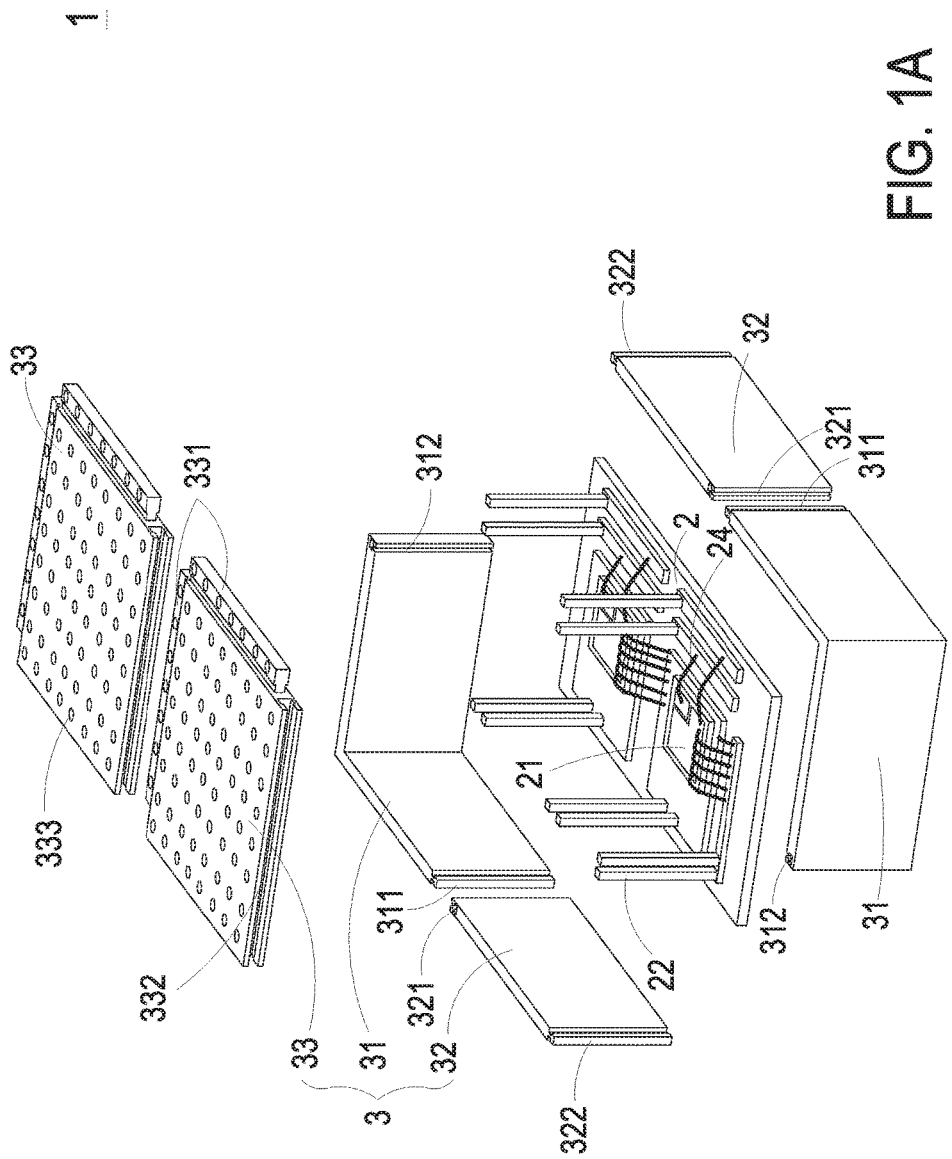
Figure 1B:
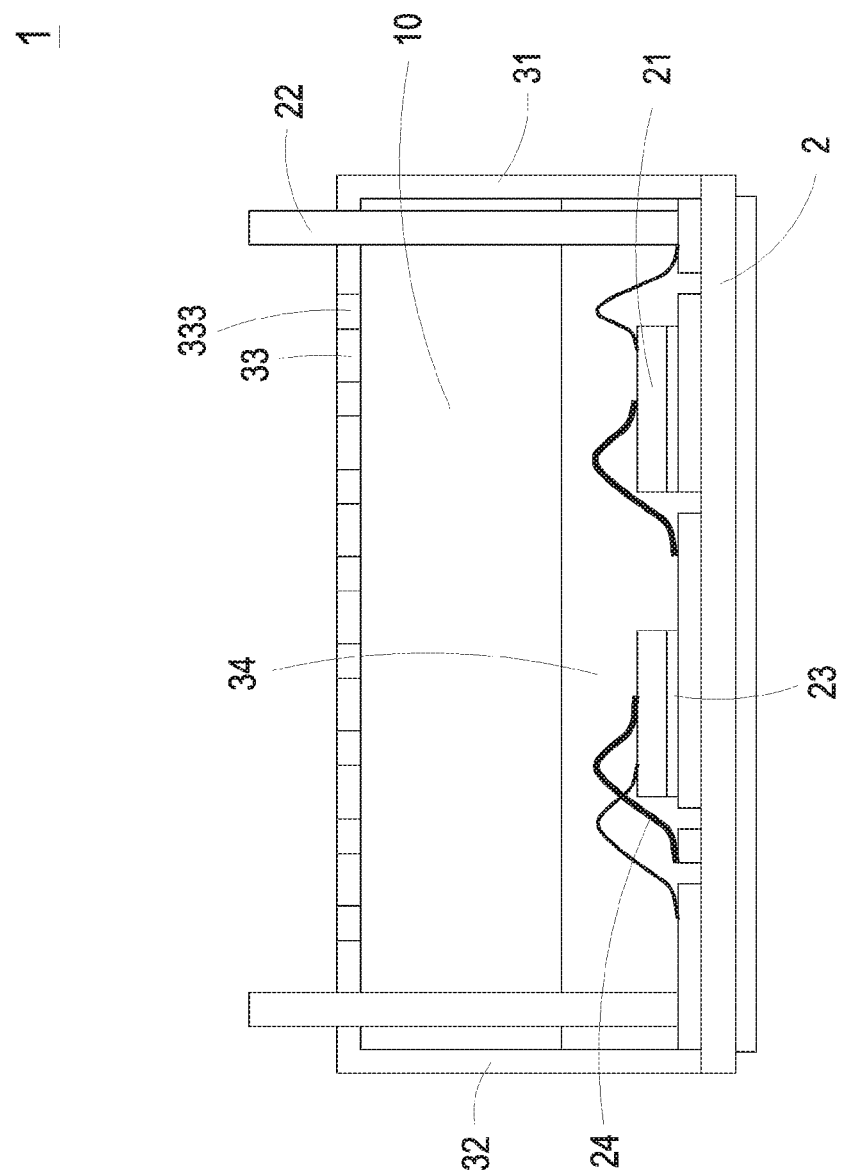

FIG. 1A is an exploded view illustrating a power module according to a first preferred embodiment of the present invention. FIG. 1B is a cross sectional view illustrating the power module of FIG. 1A. FIG. 1C is a bottom view illustrating the sidewalls and the covers of FIG. 1A. FIG. 1D is a cross sectional view illustrating the cover of FIG. 1A. As shown in FIGS. 1A to 1D, the power module 1 including a substrate 2 and a modular housing structure 3. The substrate 2 includes at least an electronic element 21 disposed thereon. The modular housing structure 3 is disposed on the substrate 2 and located around the electronic element 21. The modular housing structure 3 includes a plurality of sidewalls configured to connect with each other detachably. Each sidewall includes two connecting elements disposed on two opposite ends thereof respectively. The two connecting elements of any one of the sidewalls are connected to two corresponding connecting elements of two adjacent sidewalls respectively.

In the embodiment, the substrate 2 includes at least one electronic element 21 and at least four sides. The plurality of sidewalls of the modular housing structure 3 include two first sidewalls 31 and two second sidewalls 32. Each sidewall is formed independently. The two first sidewalls 31 have the same structure, and each first sidewall 31 includes a first connecting element 311 and a second connecting element 312 disposed on the two opposite ends of the first sidewall 31 respectively. The two second sidewalls 32 may have the same structure, and each second sidewall 32 includes a third connecting element 321 and a fourth connecting element 322 disposed on the two opposite ends of the second sidewall 32 respectively. In the embodiment, the first connecting elements 311 of the first sidewalls 31 and the third connecting elements 321 of the second sidewalls 32 are structures which can be assembled with each other. Similarly, the second connecting elements 312 of the first sidewalls 31 and the fourth connecting elements 322 of the second sidewalls 32 are matching structures and configured to connect with each other. Preferably, each first connecting element 311 and each second connecting element 312 can be a protrusion and a recess respectively; and each third connecting element 321 and each fourth connecting element 322 can be a recess and a protrusion respectively. The protrusion and the recess are matching structures and configured to be engaged or connected with each other. Alternatively, each first connecting element 311 and each second connecting element 312 can be a recess and a protrusion respectively; and each third connecting element 321 and each fourth connecting element 322 can be a protrusion and a recess respectively. In this embodiment, the first connecting element 311 may have the same or different shape with the fourth connecting element 322, and the second connecting element 312 may have the same or different shape with the third connecting element 321. In the embodiment, the two first sidewalls 31 and the two second sidewalls 32 are connected in a staggered arrangement, for example, as shown in FIG. 1C. Any two adjacent sidewalls have the end-to-end connection with each other, so that the two first sidewalls 31 and the two second sidewalls 32 are assembled together, disposed on the four sides of the substrate 2 and located around the electronic element 21 of the substrate 2. Describing in detail, any one of the first sidewalls 31 has the first connecting element 311 detachably connected to the third connecting element 321 of the adjacent second sidewall 32, and has the second connecting element 312 detachably connected to the fourth connecting element 322 of another adjacent second sidewall 32. Similarly, any one of the second sidewalls 32 has the third connecting element 321 detachably connected to the first connecting element 311 of the adjacent first sidewall 31, and has the fourth connecting element 322 detachably connected to the second connecting element 312 of another adjacent first sidewall 31. Consequently, the two first sidewalls 31 and the two second sidewalls 32 are assembled and configured to define an accommodation space 10. The electronic element 21 of the substrate 2 is accommodated in the accommodation space 10. In the embodiment, each first sidewall 31 has two portions vertically connected to each other and each portion may have the same length. Namely, the first sidewall 31 is an L-shaped sidewall. Each second sidewall 32 is formed by one portion and the portion of the second sidewall 32 may have the same length with the portion of the first sidewall 31. Namely, the second sidewall 32 is flat-plate sidewall. The two first sidewalls 31 and the two second sidewalls 32 are vertically connected with the substrate 2 respectively. The modular housing structure 3 may further include one cover and the cover is in shape of a rectangular.

In the embodiment, the modular housing structure 3 further includes two covers 33 connected with the plurality of sidewalls. The two covers 33 are both opposite and parallel to the substrate 2. The two covers 33 have same structures, such as a shape of a square, and each of the covers 33 includes two first engaging elements 331 and two second engaging elements 332. The two first engaging elements 331 are disposed on two adjacent sides of the cover 33 and the two second engaging elements 332 are disposed on another two adjacent sides of the cover 33. The first engaging element 331 of any one of the covers 33 is connected with the second engaging element 332 of the other cover 33 so as to connect two covers 33 and form a plate cover body.

In the embodiment, the two covers 33 form the plate cover body and are further connected to the two first sidewalls 31 and two second sidewalls 32 by means of for example but not limited to buckle or adhesive. The substrate 2 can be attached to the modular housing structure 3 by means of for example but not limited to buckle or adhesive. In the embodiment, the power module 1 further includes a plurality of metal terminals 22 electrically connected to the substrate 2, and each cover 33 includes a plurality of through-openings 333. Each metal terminal 22 has an end electrically connected to the substrate 2 and another end passing through the corresponding through-opening 333 of the cover 33 so that the metal terminal 22 is partially exposed from the outer surface of the cover 33. Certainly, the metal terminal 22 can be led out by a lot of methods not limited to the above embodiment. In some embodiments, the first sidewall 31 and/or the second sidewall 32 can have sidewall through-opening (not shown) for allowing the metal terminal 22 to pass therethrough, but it is not limited thereto. In other embodiment, the plurality of the though-openings 333 are arranged in arrays so as to facilitate the metal terminal 22 to pass through in different places and accomplish the circuit design with the optimized loop. It is noted that, the numbers of the first sidewalls 31, the second sidewalls 32, and the covers 33 are not limited to the above embodiments and can be adjusted and varied according the practical requirements.

In the embodiment, the substrate 2 can be for example but not limited to a power substrate. The substrate 2 can be constructed by a direct bonding copper (DBC) substrate, a direct bonding aluminum (DBA) substrate, a low-temperature co-fired ceramic (LTCC) substrate, a direct plated copper (DPC) substrate, an insulated metal substrate (IMS), a printed circuit board (PCB) or a lead frame (LF). In some embodiments, the substrate 2 further includes a conductive layer and an insulation layer. The conductive layer can be constructed by gold, silver, copper, copper-aluminum compound materials, gold-platinum, palladium-gold, palladium-silver, platinum-sliver, or palladium-copper-silver materials. The insulation layer can be constructed by alumina, aluminum nitride, silicon nitride or beryllium oxide ceramic materials, or epoxy or silicon based organic materials. The electronic element 21 can be for example but not limited to a power semiconductor chip or a power device such as an insulated gate bipolar transistor (IGBT), a metal-oxide-semiconductor field-effect transistor (MOSFET) and an integrated gate commutated thyristor (IGCT). The electronic element 21 is connected to the top surface of the substrate 2 by a connecting material 23. In the embodiment, the connecting material 23 can be for example but not limited to solder, an intermetallic compound, low-temperature-sintering materials, or conductive silver paste. Moreover, the electronic element 21 has the conductive electrodes or terminals electrically connected to the substrate 2 by a conductive element 24. The conductive element 24 can be accomplished by means of wire-bonding technology or wireless-bonding technology. The wire-bonding technology can be constructed by for example but not limited to aluminum wire, copper wire, aluminum-copper compound, gold wire, and such metal wire by ultrasonic bonding so as to accomplish the electrical connection. The wireless-bonding technology can be for example but not limited to aluminum ribbon bonding, metal-metal direct bonding, or copper clip bonding so as to obtain the electrical connection. Moreover, the aluminum ribbon bonding can be accomplished by means of ultrasonic bonding. The metal-metal direct bonding can be accomplished by means of ultrasonic welding technology and the metal can be for example but not limited to silver, copper, aluminum or gold. The copper clip bonding can be accomplished by using connecting materials as copper clip electrically connected between the chip and the conductive layer of the substrate, and the connecting materials can be for example but not limited to solder, low-temperature-sintering materials, or conductive silver paste.

In the embodiment, the power module 1 further includes a compound 34 disposed on the substrate 2 and the compound 34 is filled in the accommodation space 10 formed by the modular housing structure 3, so as to cover and protect the electronic element 21 on the substrate 2. Consequently, the package of the power module 1 is accomplished. The compound 34 can be constructed by for example but not limited to epoxy materials. In some embodiments, the plurality of metal terminals 22 which are conducted from the substrate 2 pass through the compound 34 and the through-opening 333 of the cover 33 and are led out.

Figure 2:
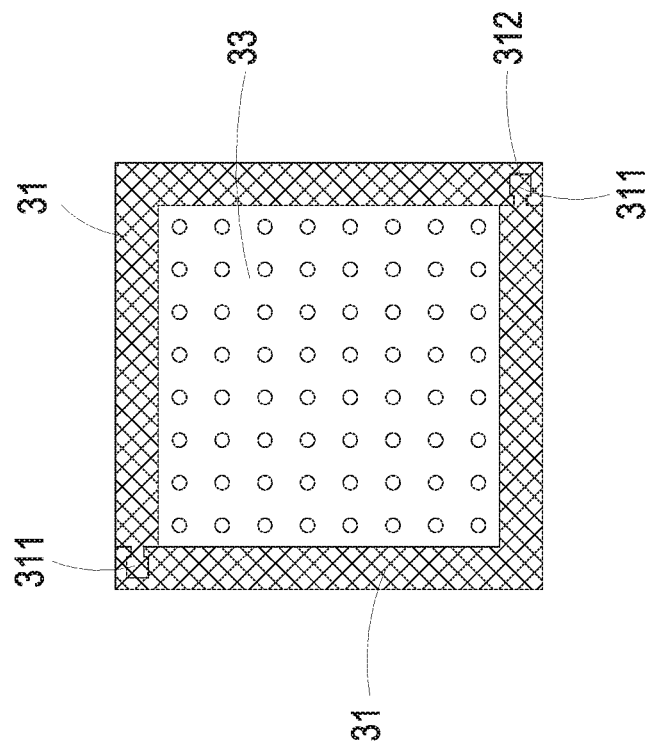
Figure 3:
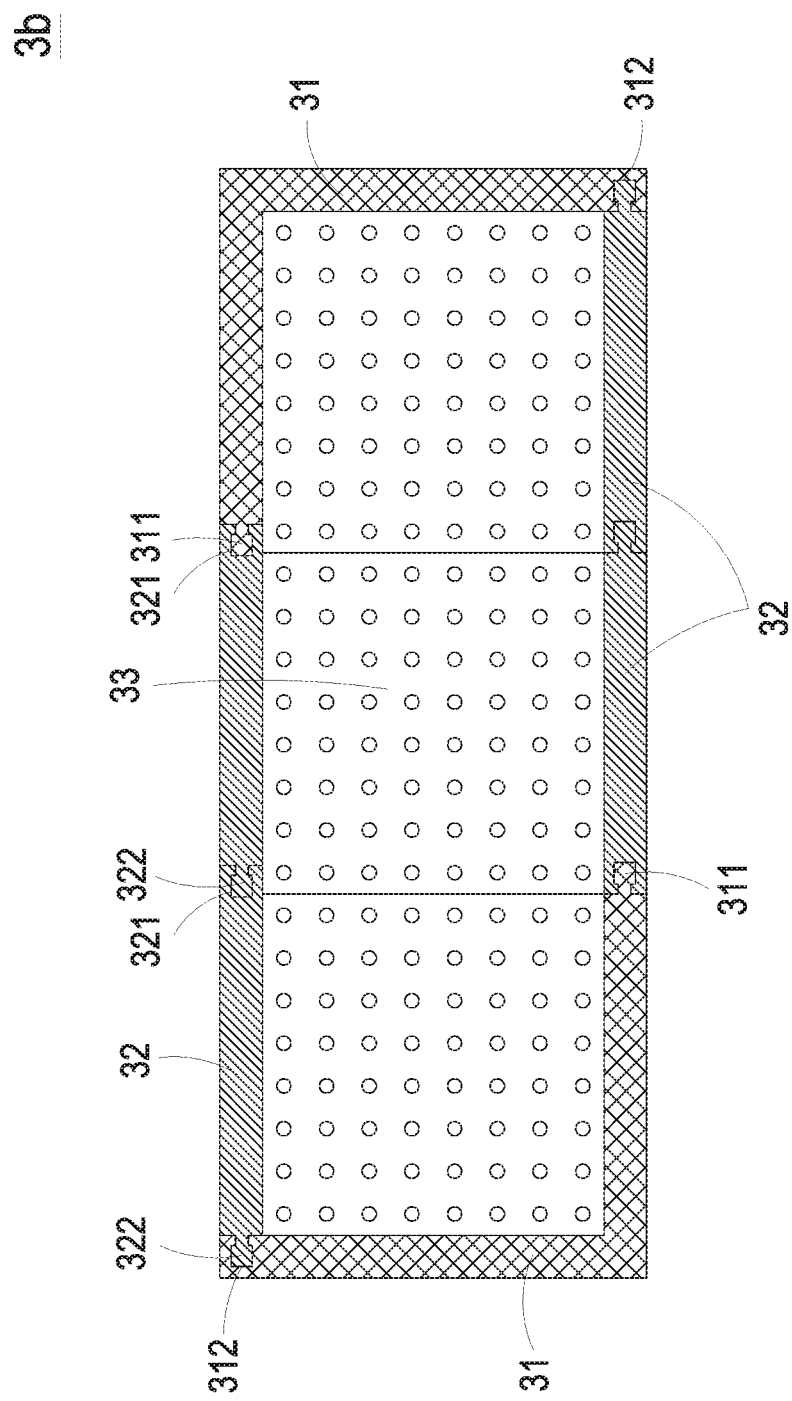

FIG. 2 is a bottom view illustrating a modular housing structure of a power module according to a second preferred embodiment of the present invention. In the embodiment, the structures, elements and functions of the modular housing structure 3a are similar to those of the modular housing structure 3 in FIGS. 1A to 1D, and are not redundantly described herein. There are also a plurality of sidewalls assembled with each other detachably and conjured to form a closed accommodation space, so as to accommodate the electronic elements and the compound. Different from the modular housing structure 3 of FIGS. 1A to 1D, the modular housing structure 3a omits two second sidewalls 32 and one cover 33. Namely, the modular housing structure 3a includes two first sidewalls 31 and a cover 33. Similarly, the first connecting element 311 of the first sidewall 31 and the second connecting element 312 of the first sidewall 31 are matching structures. Consequently, the first connecting element 311 of any one of the first sidewall 31 is connected with the second connecting element 312 of the other first sidewall 31. The second connecting element 312 of the first sidewall 31 is connected to the first connecting element 311 of the other first sidewall 31. The two first sidewalls 31 are connected with each other. In the embodiment, each first connecting element 311 and each second connecting element 312 can be a protrusion and a recess respectively. The above mentioned protrusion and recess are matching structures and configured to engaged or connected with each other. Alternatively, each first connecting element 311 and each second connecting element 312 can be a recess and a protrusion respectively. In the embodiment, the power module 1 has the substrate 2 at half size of the substrate 2 of FIGS. 1A to 1D. The substrate 2 may be in a shape of a square and the accommodation space 10 formed by the modular housing structure 3 may be in a shape of a square. The cover 33 may be in a shape of a square. But the disclosure is not limited thereto FIG. 3 is a bottom view illustrating a modular housing structure of a power module according to a third preferred embodiment of the present invention. In the embodiment, the structures, elements and functions of the modular housing structure 3b are similar to those of the modular housing structure 3 in FIGS. 1A to 1D, and are not redundantly described herein. Different from the modular housing structure 3 of FIGS. 1A to 1D, the modular housing structure 3b further adds two second sidewalls 32 and one cover 33. Namely, the modular housing structure 3b includes two first sidewalls 31, four second sidewalls 32 and three covers 33. In the embodiment, each third connecting element 321 and each fourth connecting element 322 of the second sidewalls 32 are matching structures. Consequently, the third connecting element 321 of one of second sidewalls 32 is connected and engaged with the fourth connecting element 322 of another one of the second sidewalls 32. The fourth connecting element 322 of one of second sidewalls 32 is connected and engaged with the third connecting element 321 of another one of the second sidewalls 32. In this embodiment, the first connecting element 311 may have the same shape with the fourth connecting element 322, and the second connecting element 312 may have the same shape with the third connecting element 321. Two of the second sidewalls 32 can be connected with each other so as to extend the length thereof. In the embodiment, the modular housing structure 3b has two first sidewalls 31 and four second sidewalls 32 connected together. Two ends of each first sidewall 31 are connected with two second sidewall 32 respectively. For each second sidewall 32, one end is connected with a first sidewall 31 and another end is connected with another second sidewall 32. Consequently, the modular housing structure 3b is extended along single axis. Afterward, the three covers 33 are connected to the two first sidewalls 31 and the four second sidewalls 32. According to the above embodiments, the power module 1 of the present invention can be configured to package the substrates 2 at different sizes by means of adjusting the numbers and connections of the first sidewalls 31, the second sidewalls 32 and the covers 33, so as to avoid the waste of space and enhance the power density.

Figure 4:
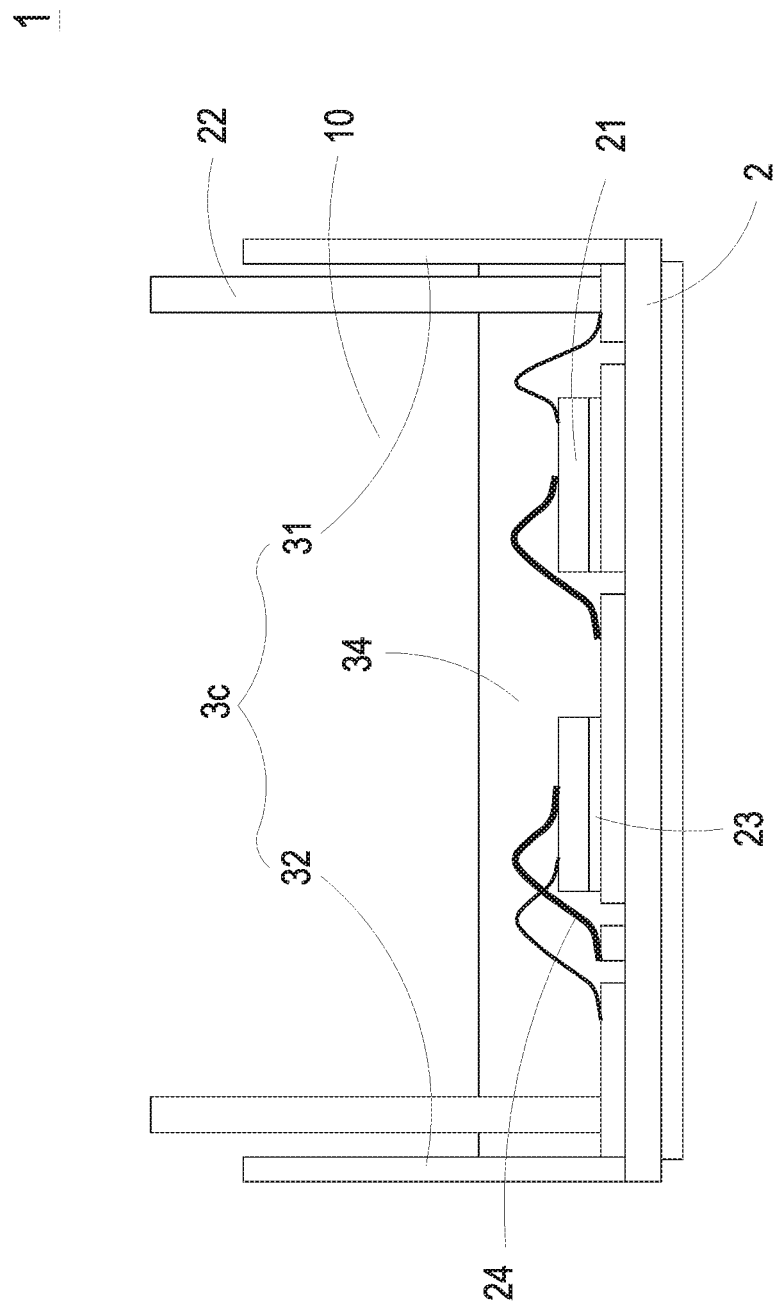

FIG. 4 is a cross sectional view illustrating a power module according to a fourth preferred embodiment of the present invention. In the embodiment, the structures, elements and functions of the modular housing structure 3c are similar to those of the modular housing structure 3 in FIGS. 1A to 1D, and are not redundantly described herein. Different from the modular housing structure 3 of FIGS. 1A to 1D, the modular housing structure 3c omits the covers 33. In the embodiment, the compound 34 is disposed in the accommodation space 10 of the modular housing structure 3c. The compound 34 covers and protects the electronic element 21 on the substrate 2, and further fixes the plurality of metal terminals 22. Consequently, the covers of the power module 1 of the present invention can be omitted according to the practical requirement so as to further reduce the manufacturing cost.

Figure 5B:
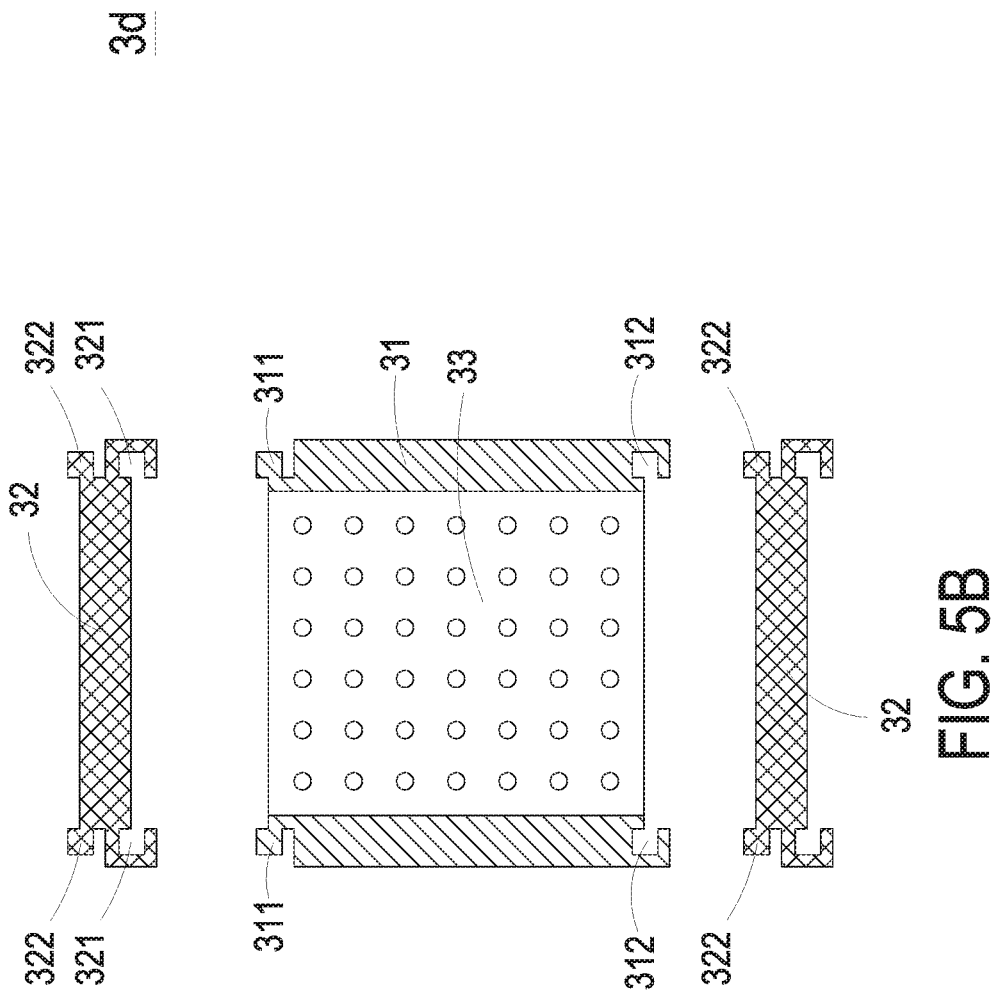
Figure 5C:
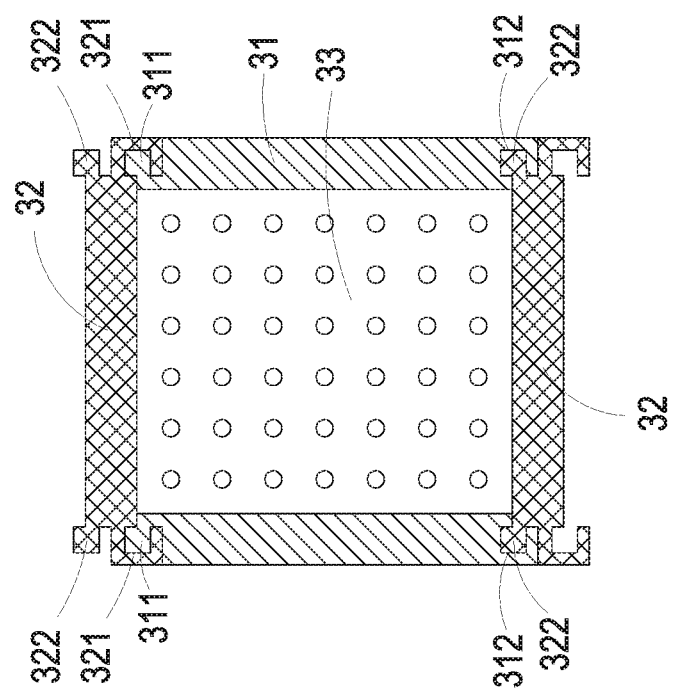

FIG. 5A is an exploded view illustrating a power module according to a fifth preferred embodiment of the present invention. FIGS. 5B and 5C are bottom views illustrating the modular housing structure of FIG. 5A in detachment and in assembly respectively. In the embodiment, the structures, elements and functions of the modular housing structure 3d are similar to those of the modular housing structure 3 in FIGS. 1A to 1D, and are not redundantly described herein. Different from the modular housing structure 3 of FIGS. 1A to 1D, the modular housing structure 3d includes two first sidewalls 31, two second sidewalls 32 and a cover 33. The first sidewalls 31 are I-shaped sidewalls. The two first sidewalls 31 are integrally formed into one piece with the cover 33 and the two first sidewalls 31 are disposed on two opposite first sides 330 of the cover 33 respectively. In the embodiment, both of the first sidewalls 31 have one first connecting element 311 and one second connecting element 312. The first connecting element 311 and the second connecting element are disposed on two ends of each first sidewall 31 respectively. The two first connecting elements 311 of the two first sidewalls 31 are both located at the one side of the cover 33 and adjacent to one second sidewall 32. The two second connecting elements 312 of the two first sidewalls 31 are both located at another side of the cover 33 and adjacent to another second sidewall 32. A third connecting element 321 and a fourth connecting element 322 disposed on each end of each second sidewall 32. Namely, each second sidewall 32 has two third connecting elements 321 disposed on two ends of the second sidewall 32 and two fourth connecting elements 322 disposed on the two ends of the second sidewall 32. In this embodiment, the first connecting element 311 may have the same or different shape with the fourth connecting element 322, and the second connecting element 312 may have the same or different shape with the third connecting element 321. As shown in FIG. 5C, the two first connecting elements 311 of a first sidewall 31 are detachably connected with the corresponding third connecting elements 321 of a second sidewall 32. The two second connecting elements 312 of the first sidewall 31 are detachably connected with the corresponding fourth connecting elements 322 of another second sidewall 32. Consequently, the modular housing structure 3d is constructed. It is noted that the numbers of the cover 33 and the first sidewalls 31 to form the integrated structure are not limited to the above embodiment. In addition, the dispatching location of the first connecting elements 311, the second connecting elements 312, the third connecting elements 321 and the fourth connecting elements 322 is not limited to the above embodiment. In other embodiment, the first connecting element 311 of one of the first sidewalls 31 and the second connecting element 312 of another one of the first sidewalls 31 may be located at the same side of the cover 33. The second sidewall 32 may have two third connecting elements 321 located at different sides thereof respectively. The second sidewall 32 may have the two fourth connecting elements 322 located at different sides thereof respectively.

Figure 6:
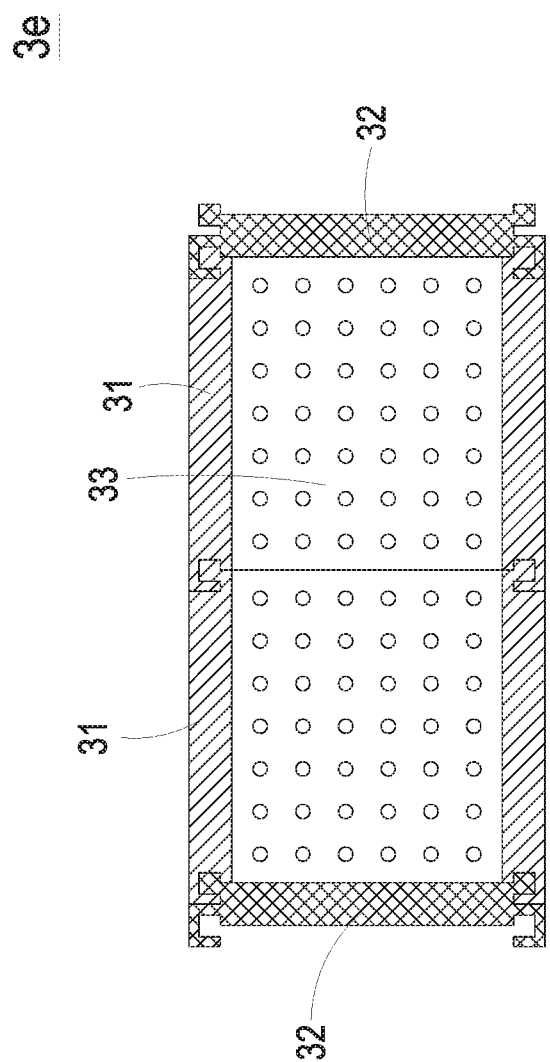

FIG. 6 is a bottom view illustrating a modular housing structure of a power module according to a sixth preferred embodiment of the present invention. In the embodiment, the structures, elements and functions of the modular housing structure 3e are similar to those of the modular housing structure 3d in FIGS. 5A to 5C, and are not redundantly described herein. Different from the modular housing structure 3d of FIGS. 5A to 5C, the modular housing structure 3e is formed by adding one more set of one cover 33 and two first sidewalls 31. Moreover, the modular housing structure 3e is configured to package the corresponding substrate 2 whose size is two times as that of the substrate 2 of FIG. 5A. In the embodiment, the added set of one cover 33 and two first sidewalls 31 are formed into one piece and is connected with another set of one cover 33 and two first sidewalls 31 formed into one piece. Afterward, two second sidewalls 32 are assembled with the above structure so as to accomplish the modular housing structure 3e. But the disclosure is not limited thereto, for example, the set of one cover 33 and two first sidewalls 31 may be formed with detachable parts.

Figure 7:
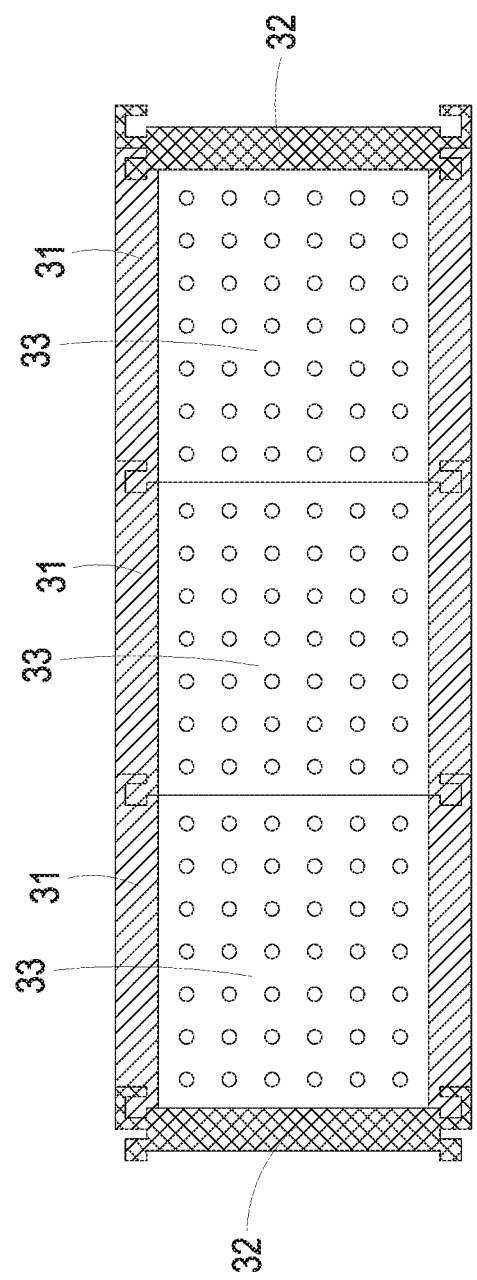

FIG. 7 is a bottom view illustrating a modular housing structure of a power module according to a seventh preferred embodiment of the present invention. In the embodiment, the structures, elements and functions of the modular housing structure 3f are similar to those of the modular housing structure 3d in FIGS. 5A to 5C, and are not redundantly described herein. Different from the modular housing structure 3d of FIGS. 5A to 5C, the modular housing structure 3f includes three sets of one cover 33 and two first sidewalls 31 formed into one piece, and two second sidewalls 32. The modular housing structure 3f is configured to package the corresponding substrate 2 whose size is three times as that of the substrate 2 of FIGS. 5A to 5C. In the embodiment, three sets of one cover 33 and two first sidewalls 31 formed into one piece are assembled together so as to extend along single axis. Afterward, two second sidewalls 32 are assembled with the above structure so as to accomplish the modular housing structure 3f. According to the above embodiments, the power module 1 can be configured to package the substrates 2 at different sizes by means of adjusting the numbers and the connections of the one-piece sets formed by the cover 33 and the first sidewalls 31, so as to avoid the waste of space and enhance the power density.

Figure 8A:
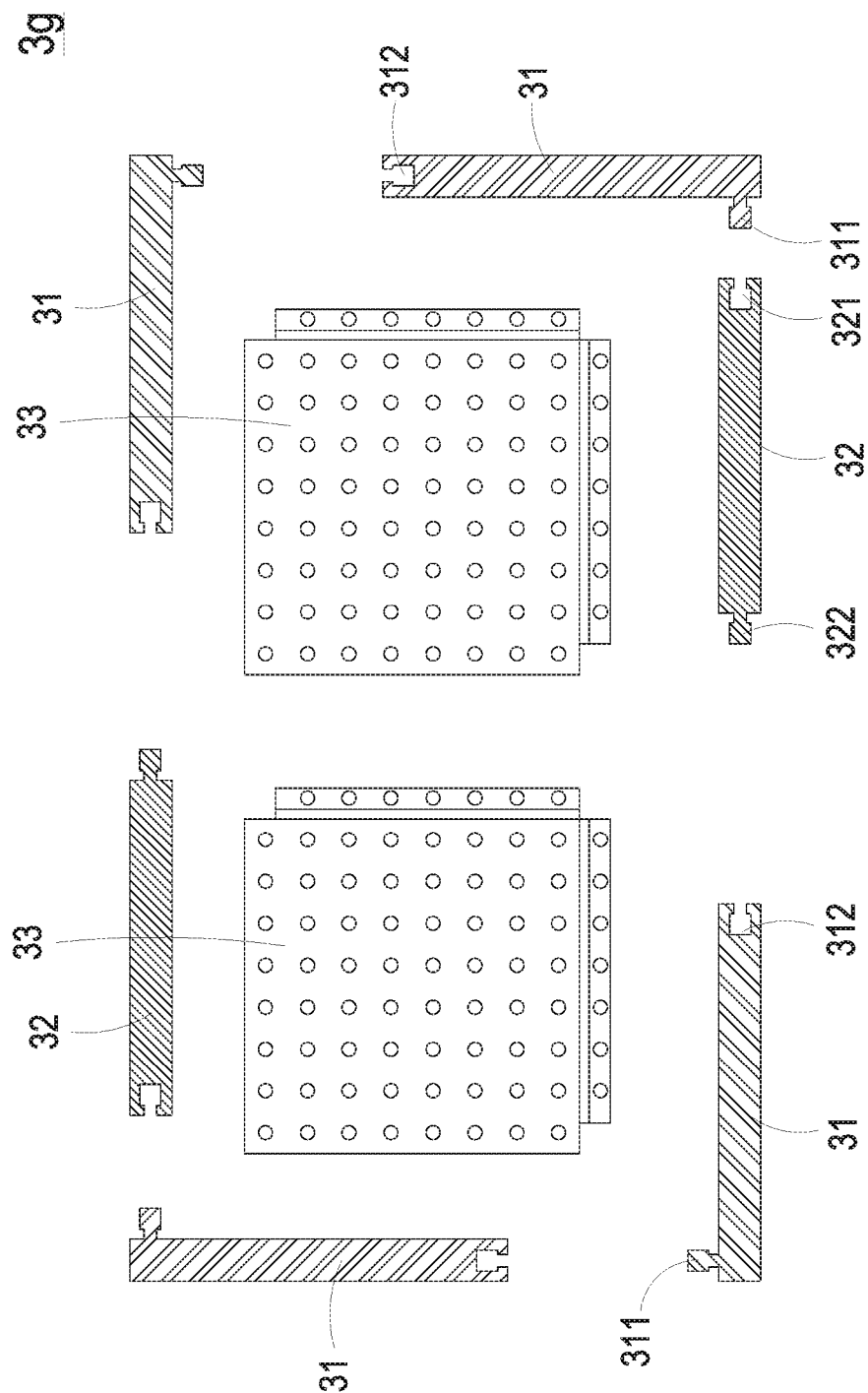
Figure 8B:
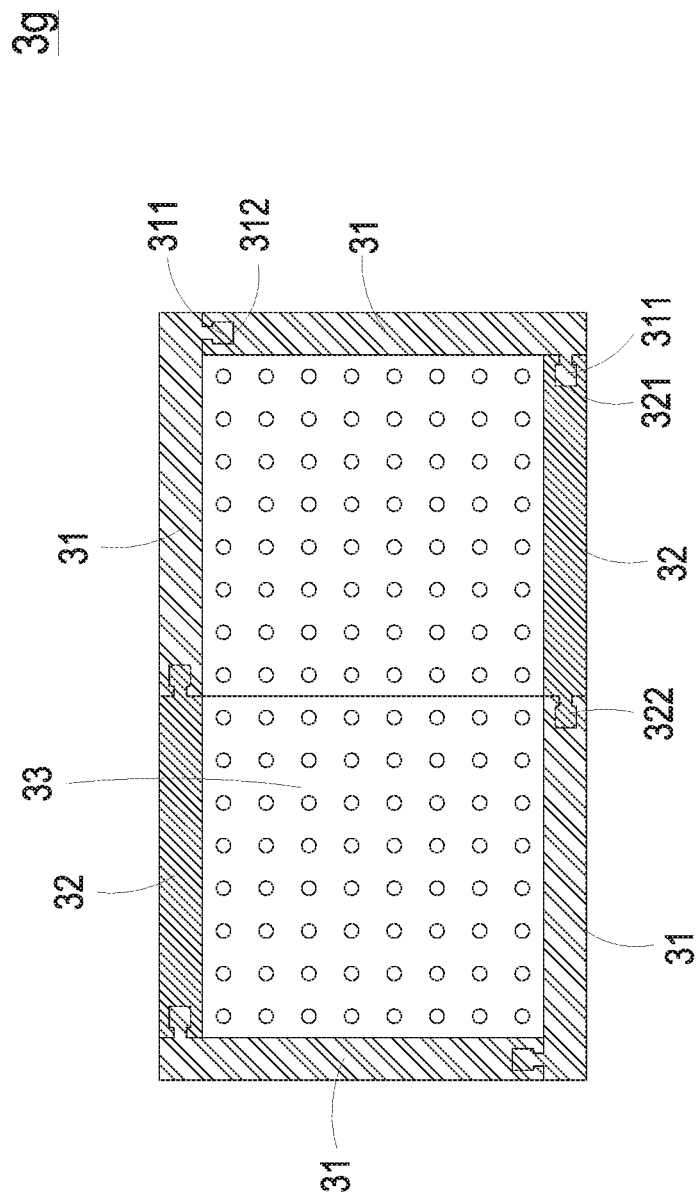

FIGS. 8A and 8B are bottom views illustrating a modular housing structure in detachment and in assembly respectively according to an eighth preferred embodiment of the present invention. In the embodiment, the structures, elements and functions of the modular housing structure 3g are similar to those of the modular housing structure 3 in FIGS. 1A to 1D, and are not redundantly described herein. Different from the modular housing structure 3 of FIGS. 1A to 1D, the modular housing structure 3g includes four first sidewalls 31, two second sidewalls 32 and two covers 33. The four first sidewalls 31 and the two second sidewalls 32 are I-shaped sidewalls and configured to package the similar substrate 2 illustrated in FIGS. 1A to 1D. In the embodiment, the four first sidewalls 31 are the same, and each first sidewall 31 includes a first connecting element 311 and a second connecting element 312 disposed on the two opposite ends of the first sidewall 31 respectively. The first connecting element 311 of the first sidewall 31 and the second connecting element 312 of the first sidewall 31 are matching structures. In the embodiment, any one of the first sidewalls 31 has the first connecting element 311 configured to match and connect with the second connecting element 312 of another one of the first sidewalls 31, and any one of the first sidewalls 31 has the second connecting element 312 configured to match and connect with the first connecting element 311 of another one of the first sidewalls 31. Consequently, two first sidewalls 31 can be assembled with each other. On the other hand, the two second sidewalls 32 are the same, and each second sidewall 32 includes a third connecting element 321 and a fourth connecting element 322 disposed on the two opposite ends of the second sidewall 32 respectively. The first connecting element 311 of one first sidewall 31 is configured to connect and engage with the third connecting element 321 of another one of the second sidewall 32. The second connecting element 312 of the first sidewall 31 is configured to connect and engage with the fourth connecting element 322 of one of the second sidewall 32. Consequently, the first sidewall 31 can be assembled with the second sidewall 32. That means, in this embodiment, the first connecting element 311 may have the same shape with the fourth connecting element 322, and the second connecting element 312 may have the same shape with the third connecting element 321. As shown in FIGS. 8A and 8B, the four first sidewalls 31 and the two second sidewalls 32 are assembled and located around the at least four sides of the substrate 2, and the two covers 33 are attached thereon, so as to accomplish the modular housing structure 3g. It is noted that the numbers of the first sidewalls 31, the second sidewalls 32 and the covers 33 are not limited to the above embodiment.

Figure 9:
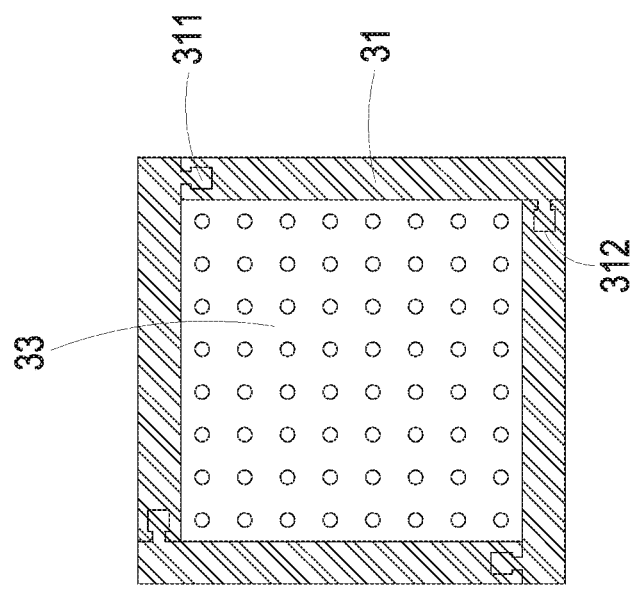
FIG. 9 is a bottom view illustrating a modular housing structure of a power module according to a ninth preferred embodiment of the present invention.

FIG. 9 is a bottom view illustrating a modular housing structure of a power module according to a ninth preferred embodiment of the present invention. In the embodiment, the structures, elements and functions of the modular housing structure 3h are similar to those of the modular housing structure 3g in FIGS. 8A to 8B, and are not redundantly described herein. Different from the modular housing structure 3g of FIGS. 8A to 8B, the modular housing structure 3h omits two second sidewalls 32. The modular housing structure 3h is configured to package the corresponding substrate 2 which is half as the substrate 2 of FIG. 8A to 8B. In the embodiment, the four I-shape first sidewalls 31 are assembled together and connected with the cover 33 so as to accomplish the modular housing structure 3h.

Figure 10:
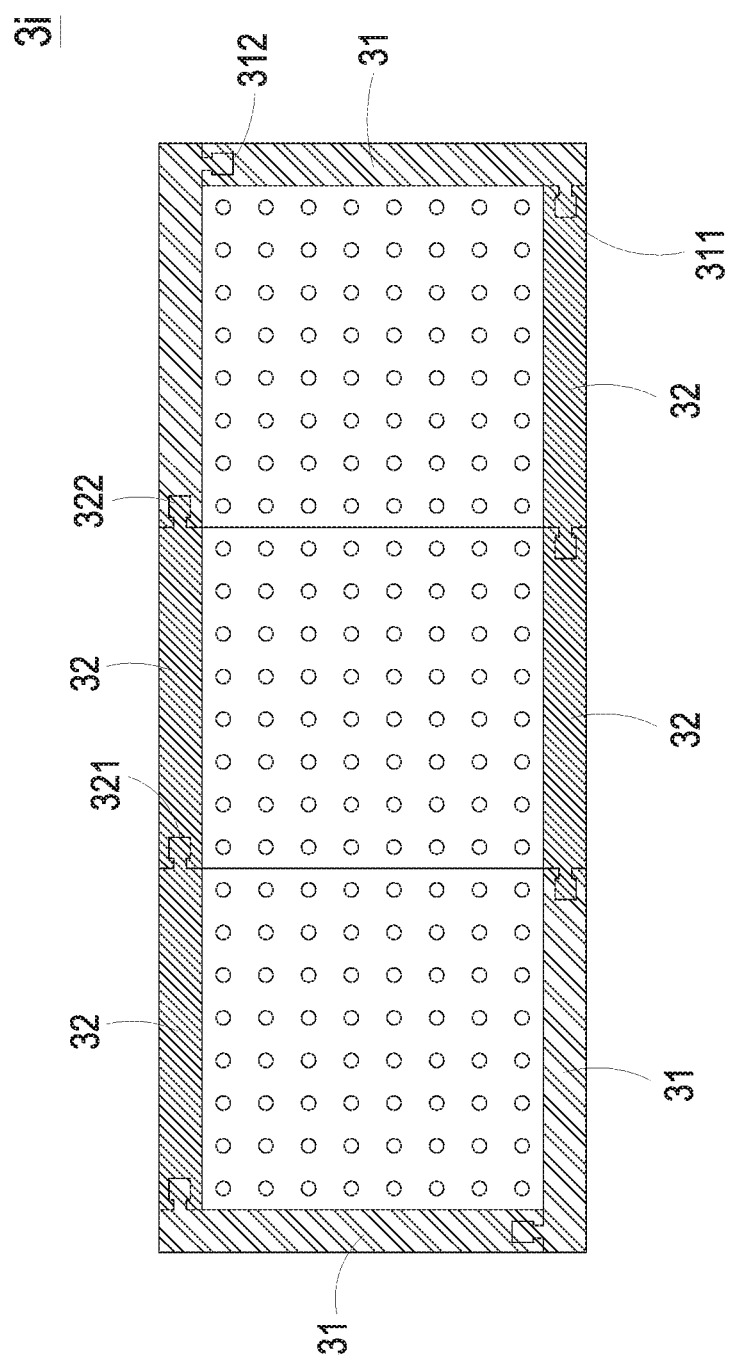
FIG. 10 is a bottom view illustrating a modular housing structure of a power module according to a tenth preferred embodiment of the present invention.

FIG. 10 is a bottom view illustrating a modular housing structure of a power module according to a tenth preferred embodiment of the present invention. In the embodiment, the structures, elements and functions of the modular housing structure 3i are similar to those of the modular housing structure 3g in FIGS. 8A to 8B, and are not redundantly described herein. Different from the modular housing structure 3g of FIGS. 8A to 8B, the modular housing structure 3i further adds two second sidewalls 32 and one cover 33. In the embodiment, the third connecting element 321 of the second sidewall 32 and the fourth connecting element 321 of the second sidewall 32 are matching structures. Any one of the second sidewalls 32 has the third connecting element 321 configured to match and connect with the fourth connecting element 322 of another one of the second sidewalls 32 or the first connecting element 311 of one first sidewall 31, and any one of the second sidewalls 32 has the fourth connecting element 322 configured to match and connect with the third connecting element 321 of the other one of the second sidewalls 32 or the second connecting element 312 of one first sidewall 31. That means, in this embodiment, the first connecting element 311 may have the same shape with the fourth connecting element 322, and the second connecting element 312 may have the same shape with the third connecting element 321. Consequently, two second sidewalls 31 can be connected with each other and the modular housing structure 3i is extended. The modular housing structure 3i in FIG. 10 is configured to package the corresponding substrate 2 whose size is one and half times as that of the substrate 2 of FIGS. 8A to 8B. In the embodiment, the four first sidewalls 31 and four second sidewalls 32 are assembled together and connected with the three cover 33 so as to accomplish the modular housing structure 3i.

Figure 11:
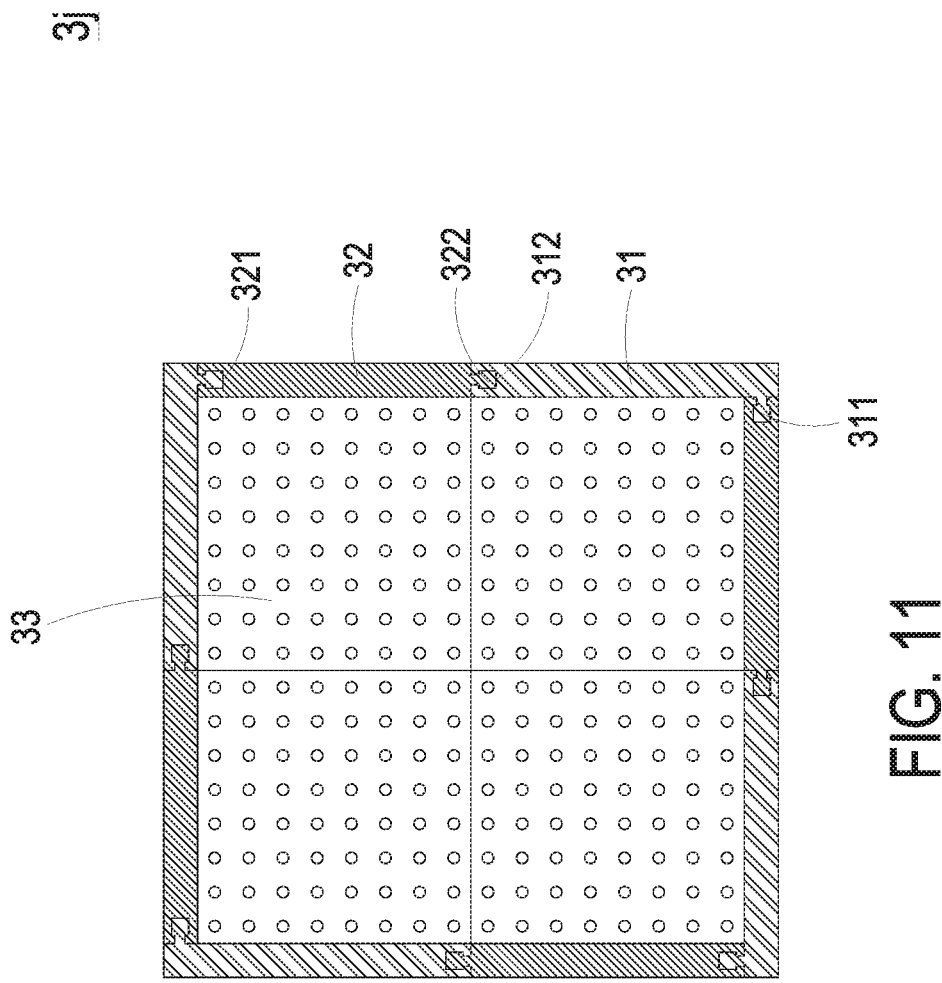
FIG. 11 is a bottom view illustrating a modular housing structure of a power module according to an eleventh preferred embodiment of the present invention.

FIG. 11 is a bottom view illustrating a modular housing structure of a power module according to an eleventh preferred embodiment of the present invention. In the embodiment, the structures, elements and functions of the modular housing structure 3j are similar to those of the modular housing structure 3g in FIGS. 8A to 8B, and are not redundantly described herein. Different from the modular housing structure 3g of FIGS. 8A to 8B, the modular housing structure 3j further adds two second sidewalls 32 and two covers 33. Moreover, the modular housing structure 3j is configured to package the corresponding substrate 2 whose size is two times as that of the substrate 2 of FIGS. 8A and 8B. In the embodiment, the four first sidewalls 31 and the four second sidewalls 32 are connected and assembled together. The four covers 33 are assembled in arrays. The above sidewalls are connected with the covers so as to accomplish the modular housing structure 3j. According to the above embodiments, the power module 1 of the present invention can be configured to package the substrates 2 at different sizes by means of adjusting the numbers and connections of the first sidewalls 31, the second sidewalls 32 and the covers 33, so as to avoid the waste of space and enhance the power density.

Figure 12A:
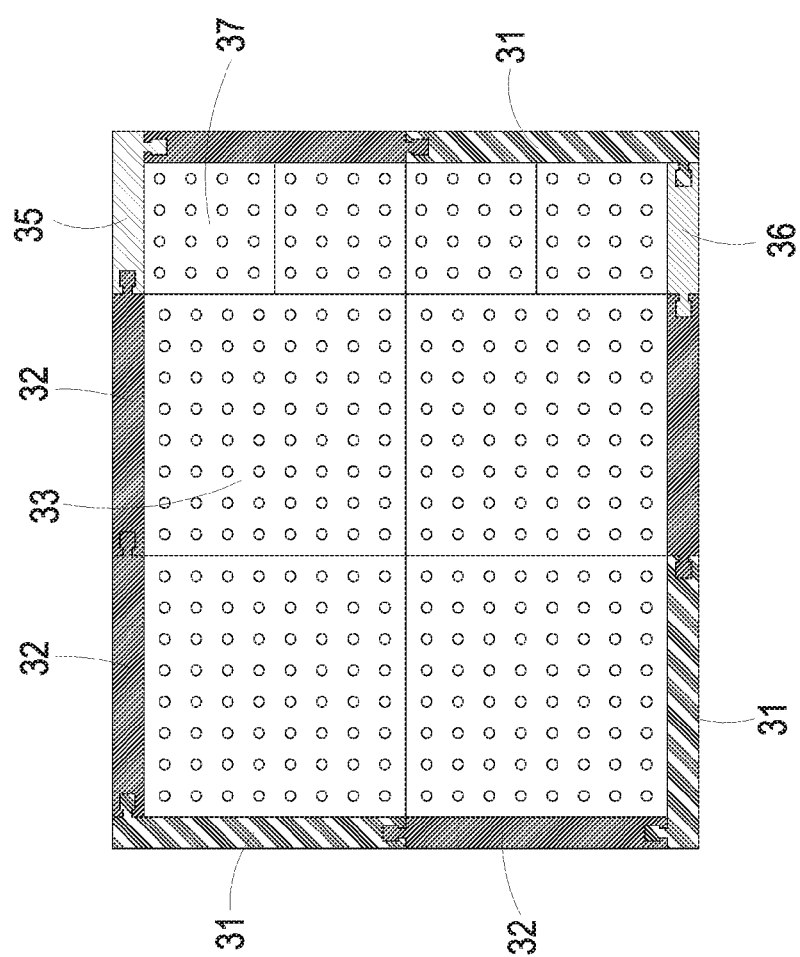
FIG. 12A is a bottom view illustrating a modular housing structure of a power module according to a twelfth preferred embodiment of the present invention.
Figure 12B:
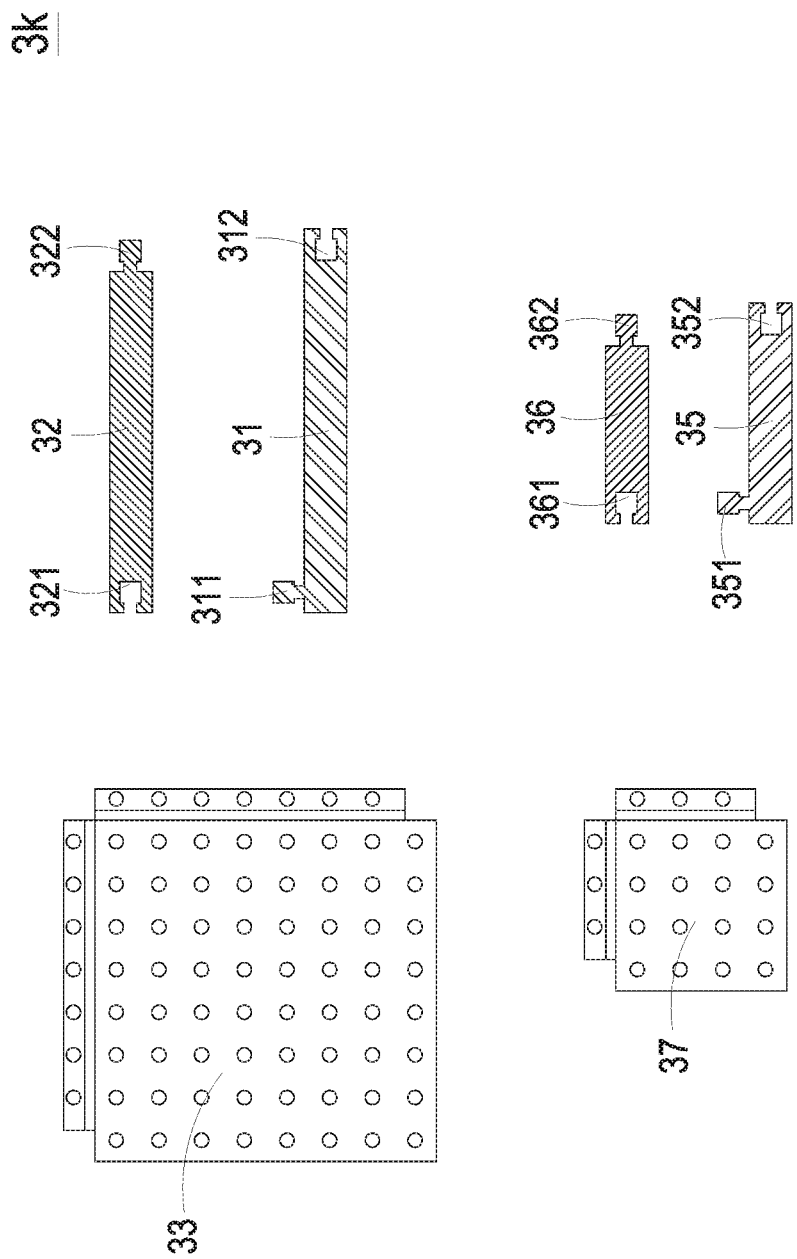
FIG. 12B is a bottom view illustrating the sidewalls and the covers of FIG. 12A.

FIG. 12A is a bottom view illustrating a modular housing structure of a power module according to a twelfth preferred embodiment of the present invention. FIG. 12B is a bottom view illustrating the sidewalls and the covers of FIG. 12A. In the embodiment, the structures, elements and functions of the modular housing structure 3k are similar to those of the modular housing structure 3i in FIG. 10, and are not redundantly described herein. Different from the modular housing structure 3i of FIG. 10, the modular housing structure 3k includes at least two sets of sidewalls with different lengths. In the embodiment, the first sidewall 31 and the second sidewall 32 have the same length. The third sidewall 35 and the fourth sidewall 36 have the same length but different from that of the first sidewall 31 and the second sidewall 32. Consequently, in the modular housing structure 3k, the numbers and the connections of the sidewalls may be adjustable according to the size of the substrate 2, so as to avoid the waste of space and enhance the power density. In the embodiment, the modular housing structure 3k includes three first sidewalls 31, five second sidewalls 32, one third sidewall 35, one fourth sidewall 36, four first covers 33 and four second covers 37 for packaging the substrate 2. In the embodiment, the three first sidewalls 31 have the same structure, and each first sidewall 31 includes a first connecting element 311 and a second connecting element 312 disposed on the two opposite ends of the first sidewall 31 respectively. The five second sidewalls 32 have the same structure, and each second sidewall 32 includes a third connecting element 321 and a fourth connecting element 322 disposed on the two opposite ends of the second sidewall 32 respectively. The third sidewall 35 includes a fifth connecting element 351 and a sixth connecting element 352 disposed on the two opposite ends of third sidewall 35 respectively. The fourth sidewall 36 includes a seventh connecting element 361 and an eighth connecting element 362 disposed on the two opposite ends of fourth sidewall 36 respectively. In the embodiment, the third sidewall 35 and the first sidewall 31 have a similar structure but the length of the third sidewall 35 is half of the length of the first sidewall 31. The structures of the fifth connecting element 351 and the sixth connecting element 352 are as same as the structures of the first connecting element 311 and the second connecting element 312 respectively. The fourth sidewall 36 and the second sidewall 32 have a similar structure but the length of the fourth sidewall 36 is half of the length of the second sidewall 32. The structures of the seventh connecting element 361 and the eighth connecting element 362 are as same as the structures of the third connecting element 321 and the fourth connecting element 322 respectively. Moreover, the first cover 33 and the second cover 37 have similar structures but the length and the width of the second cover 37 are half of the length and the width of the first cover 33 respectively. In the embodiment, the fifth connecting element 351 of the third sidewall 35 is configured to match and detachably connect with the third connecting element 321 of the adjacent second sidewall 32, and the sixth connecting element 352 of the third sidewall 35 is configured to match and detachably connect with the fourth connecting element 322 of the other adjacent second sidewall 32. The seventh connecting element 361 of the fourth sidewall 36 is configured to match and detachably connect with the first connecting element 311 of the adjacent first sidewall 31, and the eighth connecting element 362 of the fourth sidewall 36 is configured to match and detachably connect with the third connecting element 321 of the adjacent second sidewall 32. As shown in FIG. 12A and FIG. 12B, the three first sidewalls 31, the five second sidewalls 32, the third sidewall 35 and the fourth sidewall 36 are connected in series and located around the four sides of the corresponding substrate 2, and then the assembly of four first covers 33 and four second covers 37 is connected thereon. Consequently, the modular housing structure 3k is accomplished. The modular housing structure 3k in FIG. 12A is configured to package the corresponding substrate 2 whose size is two and half times as that of the corresponding substrate 2 packaged by the modular housing structure 3g in FIGS. 8A to 8B. It is noted that the numbers and the connections of the first sidewalls 31, the second sidewalls 32, the third sidewalls 36, the fourth sidewalls 37, the first covers 33 and the second covers 37 are not limited to the above embodiments and can be adjusted and varied according the practical requirements. In other embodiment, for packaging the specific substrate with different length and width, the first sidewalls 31, the second sidewalls 32, the third sidewalls 35 and the fourth sidewalls 36 may be connected in series and located around the sides of the substrate 2, and the assembly of the first covers 33 and the second covers 37 corresponding to the size of the substrate 2 is attached thereto. Consequently, the package for several substrates 2 having different sizes can be accomplished.

Figure 13A:
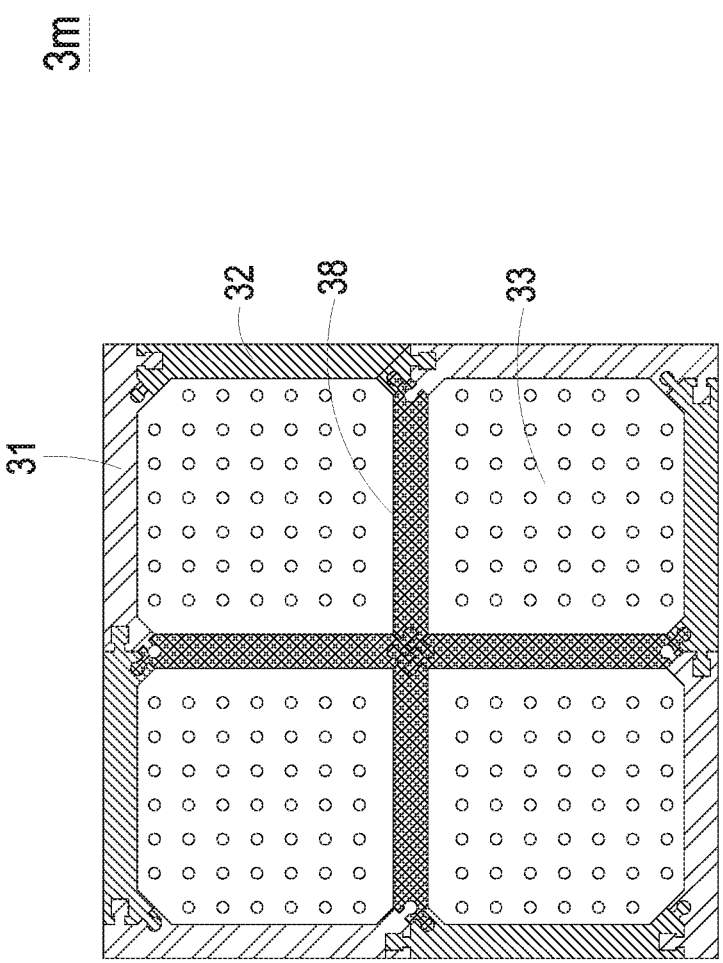
FIG. 13A is a bottom view illustrating a modular housing structure of a power module according to a thirteenth preferred embodiment of the present invention.
Figure 13B:
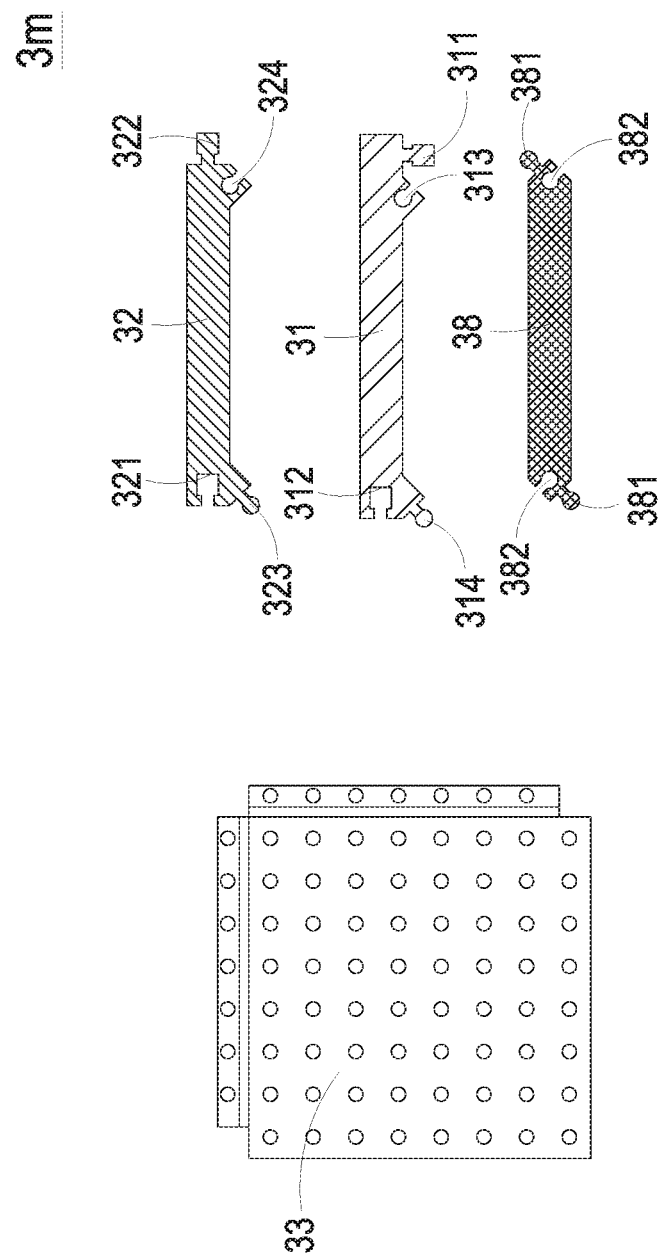
FIG. 13B is a bottom view illustrating the sidewalls and the covers of FIG. 13A.

FIG. 13A is a bottom view illustrating a modular housing structure of a power module according to a thirteenth preferred embodiment of the present invention. FIG. 13B is a bottom view illustrating the sidewalls and the covers of FIG. 13A. In the embodiment, the structures, elements and functions of the modular housing structure 3m are similar to those of the modular housing structure 3j in FIG. 11, and are not redundantly described herein. Different from the modular housing structure 3j of FIG. 11, the modular housing structure 3m further includes at least an auxiliary wall 38, for example four auxiliary walls 38. Each auxiliary wall 38 includes two first auxiliary connecting elements 381 and two second auxiliary connecting elements 382. The two first auxiliary connecting elements 381 are disposed on two ends of the auxiliary wall 38 respectively, and the two second auxiliary connecting elements 382 are disposed on two ends of the auxiliary wall 38 respectively. Each first sidewall 31 further includes a third auxiliary connecting element 313 and a fourth auxiliary connecting element 314 disposed on two ends thereof respectively. Each second sidewall 32 further includes a fifth auxiliary connecting element 323 and a sixth auxiliary connecting element 324 disposed on two ends thereof. In the embodiment, the structure of the first auxiliary connecting element 381 of the auxiliary wall 38 is matching to that of the second auxiliary connecting element 382 and the sixth auxiliary connecting element 324 of the second sidewall 32 respectively. The structure of the second auxiliary connecting element 382 of the auxiliary wall 38 is matching to that of the first auxiliary connecting element 381 and the fourth auxiliary connecting element 314 of the first sidewall 31 respectively. Furthermore, the structure of any third auxiliary connecting element 313 of the first sidewall 31 is matching to that of any fifth auxiliary connecting element 323 of the second sidewall 32 respectively. In the embodiment, the first auxiliary connecting element 381, the fourth auxiliary connecting element 314 and the fifth auxiliary connecting element 323 can be constructed by a protrusion respectively. The second auxiliary connecting element 382, the third auxiliary connecting element 313 and the sixth auxiliary connecting element 324 can be constructed by a recess respectively. The protrusion and the recess are matching structures and configured to engaged or connected with each other. In the embodiment, any one of the auxiliary wall 38 has one first auxiliary connecting element 381 and one second auxiliary connecting element 382 disposed on one end of the auxiliary wall 38 and respectively connected to the second auxiliary connecting element 382 and the first auxiliary connecting element 381 disposed on the other auxiliary walls 38, and this end of the auxiliary wall 38 can be assigned as a first end. In addition, any one of the auxiliary wall 38 has another first auxiliary connecting element 381 and another second auxiliary connecting element 382 disposed on another end of the auxiliary wall 38 and respectively connected to the sixth auxiliary connecting element 324 of the second sidewall 32 and the fourth auxiliary connecting element 314 of the first sidewall 31, and this end of the auxiliary wall 38 can be assigned as a second end. Each first sidewall 31 further has the third auxiliary connecting element 313 configured to connect with the fifth auxiliary connecting element 323 of the second sidewall 32. It is noted that the numbers of the first sidewalls 31, the second sidewalls 32, the auxiliary walls 38 and the covers 33 are not limited to the above embodiment. Moreover, the dispatching locations of the first auxiliary connecting elements 381, the second auxiliary connecting elements 382, the third auxiliary connecting elements 313, the fourth auxiliary connecting elements 314, the fifth auxiliary connecting elements 323 and the sixth auxiliary connecting elements 324 are adjustable according to the dispatching location of the electronic element 21 on the substrate 2. Comparing the embodiment with the above ones, the auxiliary walls 38 are further introduced into the modular housing structure 3m so as to increase the mechanical strength thereof and further accomplish the compartment application of the accommodation space 10 in the power module 1.

Figure 14A:
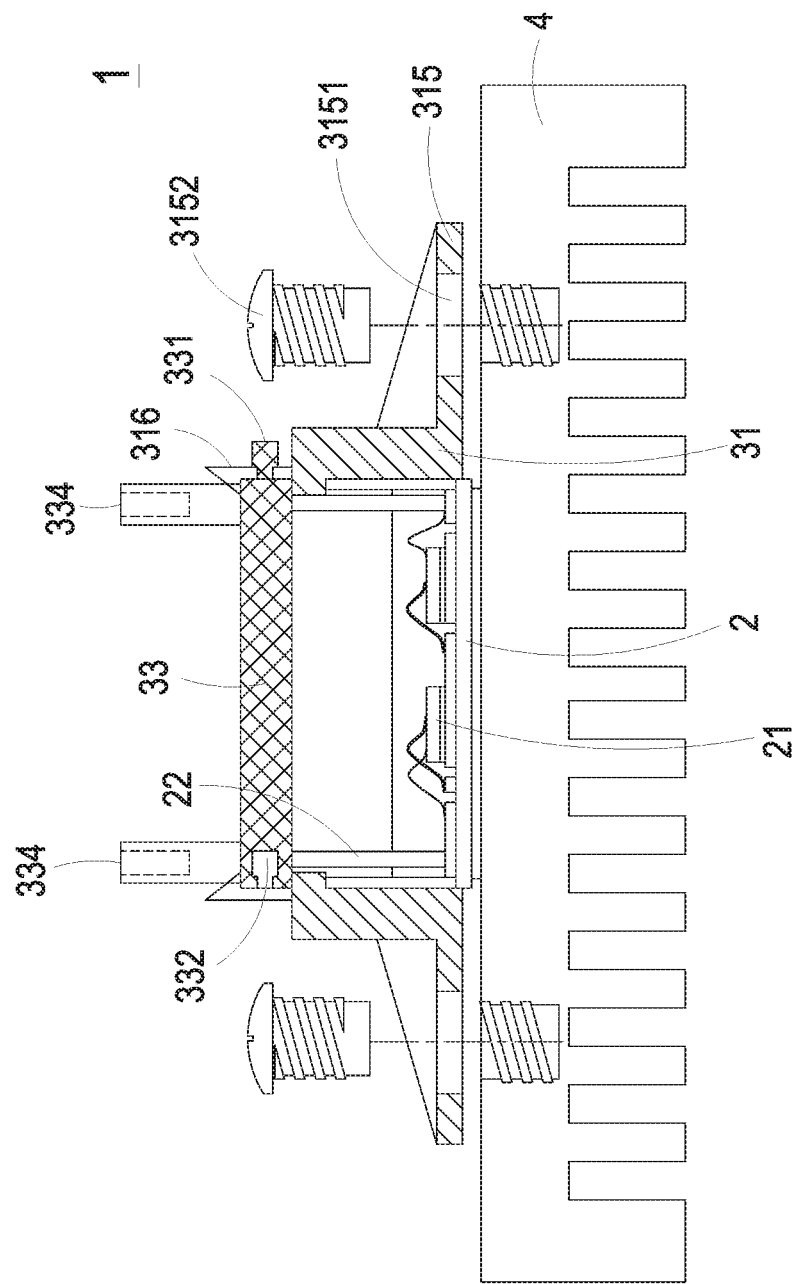
FIG. 14A is a cross sectional view illustrating a power module according to a fourteenth preferred embodiment of the present invention.
Figure 14B:
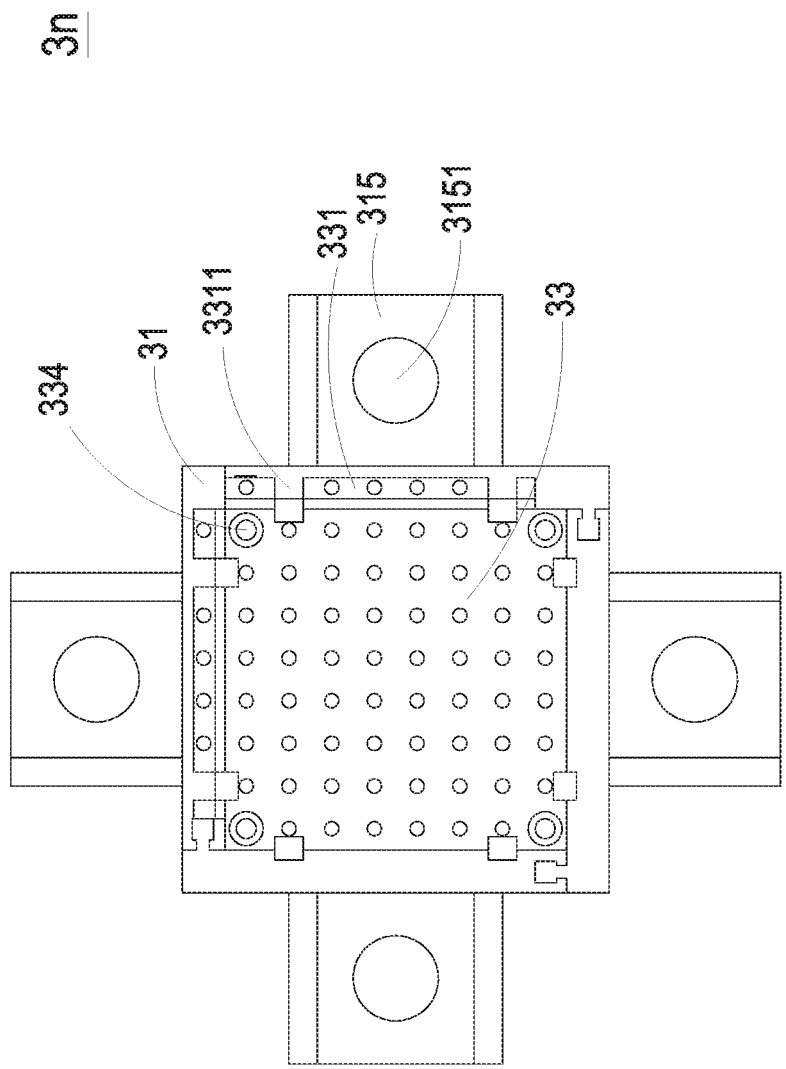
FIG. 14B is a top view illustrating the power module of FIG. 14A.

In the above embodiments, the cover 33 can be connected with the first sidewall 31 or the second sidewall 32 by for example but not limited to an integral forming connection, an adhesion connection or a buckle connection. FIG. 14A is a cross sectional view illustrating a power module according to a fourteenth preferred embodiment of the present invention. FIG. 14B is a top view illustrating the power module of FIG. 14A. In the embodiment, the structures, elements and functions of the modular housing structure 3n are similar to those of the modular housing structure 3h in FIG. 9, and are not redundantly described herein. Different from the modular housing structure 3h of FIG. 9, the first sidewall 31 of the modular housing structure 3n further includes at least an extension portion 315 disposed on the outer side thereof and outwardly extended from the bottom of the first sidewall 31 nearby the substrate 2 so as to fasten the modular housing structure 3n on the surface of an object 4 by for example but not limited to a screw. The object 4 can be for example but not limited to a heatsink, a heat spreader or a cooling system. In the embodiment, the extension portion 315 further includes at least a fixing hole 3151. There is a locking piece 3152, for example but not limited to a screw, passing through the fixing hole 3151 so as to fasten the modular housing structure 3n and the substrate 2 of the power module 2 on the object 4. Certainly, the extension portion 315 is fixed on the object 4 by the above method, but it is not limited thereto. In the embodiment, the first sidewall 31 further includes at least a first fastening element 316 disposed on the upper side of the first sidewall 31. The first fastening element 316 can be for example but not limited to a fitting hook or a buckle and configured to engage with the cover 33 on the upper side of the first sidewall 31 so as to fasten and connect the cover 33 with the first sidewall 31. Moreover, the cover 33 includes a corresponding recess 3311 disposed on the first engaging element 331 so that the first fastening element 316 passes therethrough and fastens the cover 33 on the upper side of the first sidewall 31. Alternatively, in other embodiment, the first fastening element 316 may be disposed on the upper side of the second sidewall 32 and the cover 33 includes the corresponding recess 3311 for allowing the first fastening element to pass therethrough, but it is not limited thereto. It is noted that the cover 33 connected with the first sidewall 31 and the second sidewall 32 by for example but not limited to the above described method, an adhesion connection, a buckle connection or an integral forming connection. Alternatively, in some embodiments, the modular housing structure has the compound 34 constructed by epoxy materials so that the electronic element 21 on the substrate 2 is covered and protected by the compound 34 and the metal terminal 22 is fixed thereon. The cover 33 can be selectively disposed thereon or omitted as shown in FIG. 4.

Further referring to FIGS. 14A and 14B, in the embodiment, the cover 33 of the modular housing structure 3n further includes a second fastening element 334 disposed on the top surface of the cover 33 and configured to fasten the modular housing structure 3n to an attachment (not shown). The attachment can be for example but not limited to a driving board. It is noted that the dispatching location of the second fastening element 334 is not limited to the above embodiment. In other embodiments, the second fastening element 334 is disposed and located according to the dispatching location of the through-opening 333 of the cover 33 or the metal terminal 22 passing therethrough, but it is not limited thereto.

Figure 15B:
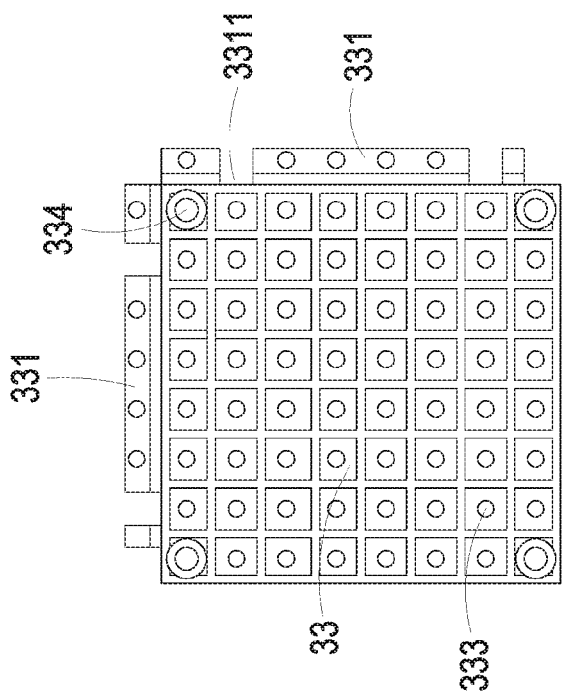
FIG. 15B is a top view illustrating the cover of the modular housing structure according to another preferred embodiment of the present invention.
Figure 15A:
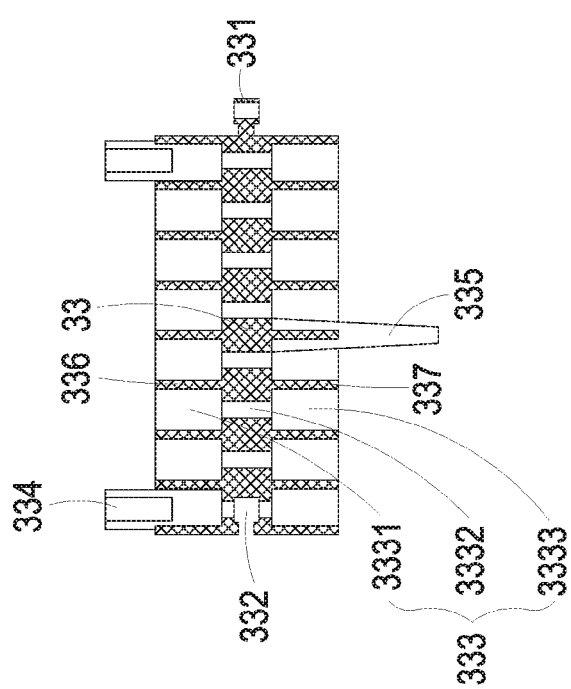
FIG. 15A is a cross sectional view illustrating the cover of the modular housing structure according to another preferred embodiment of the present invention.

FIG. 15A is a cross sectional view illustrating the cover of the modular housing structure according to another preferred embodiment of the present invention. FIG. 15B is a top view illustrating the cover of the modular housing structure according to another preferred embodiment of the present invention. As shown in FIGS. 15A and 15B, the cover 33 is similar to the above embodiments. The cover 33 includes a plurality of through-openings 333 for allowing the metal terminal 22 led out from the substrate 2 to pass through the through-opening 333. In the embodiment, the through-openings 333 of the cover 33 are deep through holes and arranged on the cover 33 in arrays. Each through-opening 333 includes an upper through hole 3331, a middle through hole 3332 and a lower through hole 3333 disposed from up to down. The radius of the middle through hole 3332 is smaller than the radii of the upper through hole 3331 and the lower through hole 3333. There is an upper partition 336 between every two upper through holes 3331 to separate one from the other. There is a lower partition 337 between every two lower through holes 3333 to separate one from the other. Each through-opening 333 has at least a middle through hole 3332 for allowing the metal terminal 22 to pass therethrough. The metal terminal 22 may contact with the inner wall of the middle through hole 3332 but not to contact with the upper partition 336 or the lower partition 337. Namely, the upper partition 336 and the lower partition 337 provide the electrical creepage path meeting a specific standard and improve the mechanical strength of the cover 33. In the embodiment, the cover 33 further includes at least a protruding portion 335 disposed on the lower surface of the cover 33, accommodated in the accommodation space 10 of the power module 1 and configured to push against the substrate 2 so as to provide the mechanical support.

Figure 15C:
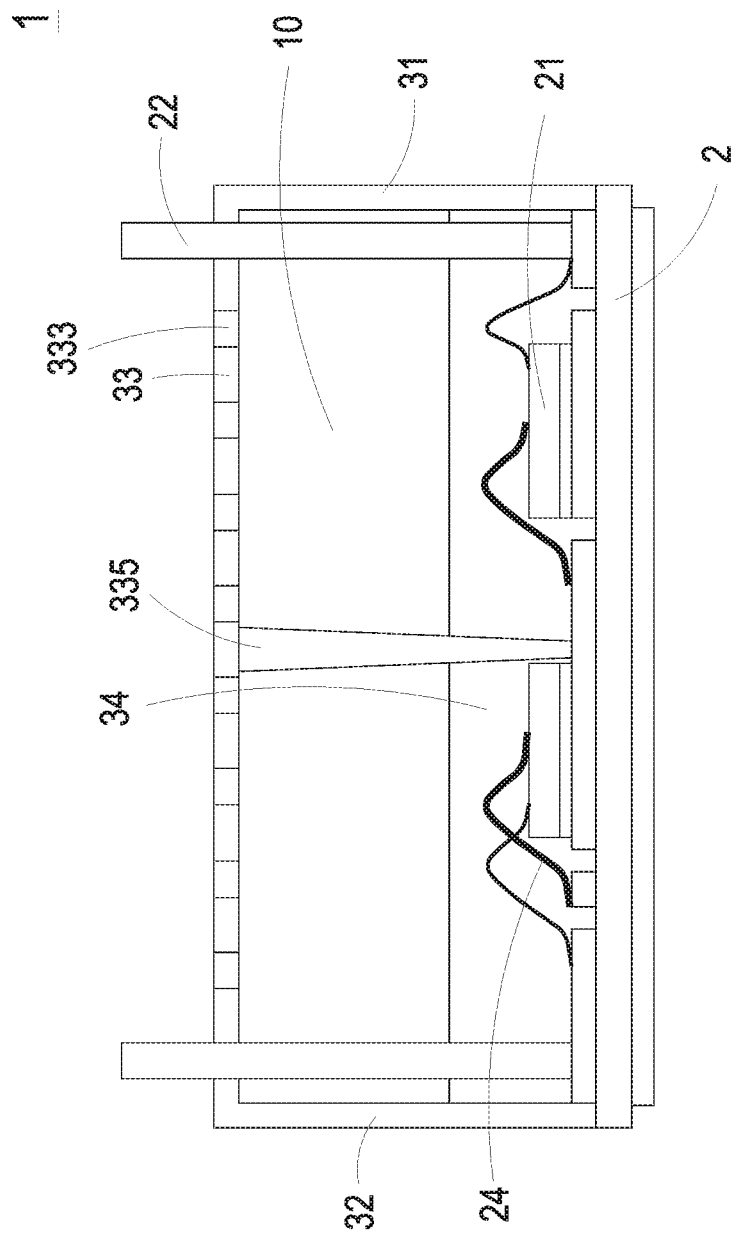
FIG. 15C is a cross sectional view illustrating a power module according to a fifteenth preferred embodiment of the present invention.

FIG. 15C is a cross sectional view illustrating a power module according to a fifteenth preferred embodiment of the present invention. In the embodiment, the structures, elements and functions of the power module 1 are similar to those of the power module 1 in FIGS. 1A to 1D, and are not redundantly described herein. Different from the power module 1 of FIGS. 1A to 1D, the cover 33 of the power module 1 further includes a protruding portion 335 disposed on the lower surface of the cover 33, accommodated in the accommodation space 10 of the power module 1 and configured to push against the substrate 2 so as to provide the mechanical support. It is noted that the dispatching location and the protruding length of the protruding portion 335 are not limited to the above embodiment and can be adjusted according to the dispatching location of the electronic element 21 on the substrate 2.

In summary, the present disclosure provides a power module having a modular housing structure. The modular housing structure has flexible number sidewalls configured to provide an adjustable assembly according to the size of substrate, so as to prevent from the waste of space and enhance the power density. While developing the new topology or power level, there is no need of remolding a new outer housing structure for accommodating a larger substrate, and the space waste caused by accommodating a smaller substrate within the larger outer housing structure can be prevented. Consequently, the entire manufacturing cost can be reduced, the power density of the power module can be enhanced, and the product will be more competitive. On the other hand, the modular housing structure includes modular and extendable sidewalls and covers, which are configured to package different substrates with varied sizes, so as to accomplishing the entire structure with optimized strength and high power density.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A power module comprising:
   a substrate having an electronic element disposed thereon; and
   a modular housing structure disposed on the substrate and located around the electronic element, wherein the modular housing structure comprises a plurality of sidewalls configured to connect with each other detachably, and each sidewall comprises two connecting elements disposed on two opposite ends thereof respectively, wherein the two connecting elements of any one of the sidewalls are connected to two corresponding connecting elements of two adjacent sidewalls respectively, wherein the modular housing structure further comprises a plurality of covers opposite to the substrate and connected to the plurality of sidewalls, and each cover comprises two first engaging elements and two second engaging elements, wherein the two first engaging elements are disposed on two adjacent sides of the cover and the two second engaging elements are disposed on the other two adjacent sides of the cover, wherein the first engaging element of any one of the covers is configured to connect with the second engaging element of another one of the covers.

2. The power module according to claim 1, wherein the plurality of sidewalls comprise at least two first sidewalls, and each first sidewall comprises a first connecting element and a second connecting element disposed on the two opposite ends thereof respectively, wherein the first connecting element and the second connecting element are matching structures to each other.

3. The power module according to claim 2, wherein the first connecting element of any one of the first sidewalls is connected with the corresponding second connecting element disposed on another one of the first sidewalls, and the second connecting element of any one of the first sidewalls is connected with the corresponding first connecting element disposed on another one of the first sidewalls, so as to detachably assemble the at least two first sidewalls located around at least four sides of the substrate.

4. The power module according to claim 2, wherein the plurality of sidewalls further comprise at least two second sidewalls, and each second sidewall comprises a third connecting element and a fourth connecting element disposed on the two opposite ends thereof respectively, wherein the structure of the third connecting element is matching to the structures of the fourth connecting element of the second sidewall and the first connecting element of the first sidewall, and the structure of the fourth connecting element is matching to the structures of the third connecting element of the second sidewall and the second connecting element of the first sidewall.

5. The power module according to claim 4, wherein the first sidewalls and the second sidewalls are connected in a stagger arrangement and located around at least four sides of the substrate, wherein the third connecting element of each one of the second sidewalls is connected to the first connecting element of one of the adjacent first sidewalls, and the fourth connecting element of each one of the second sidewalls is connected to the second connecting element of one of the adjacent first sidewalls, so as to assemble the first sidewalls and the second sidewalls detachably.

6. The powder module according claim 4, wherein the number of second sidewalls is at least four, the at least two first sidewalls and the at least four second sidewalls are connected with each other and located around at least four sides of the substrate, wherein the third connecting element of any one of the second sidewalls is connected to the first connecting element of one of the adjacent first sidewall or the fourth connecting element of one of the adjacent second sidewall, and the fourth connecting element of any one of the second sidewalls is connected to the second connecting element of one of the adjacent first sidewall or the third connecting element of one of the adjacent second sidewall, so as to assemble the at least two first sidewalls and the at least four second sidewalls detachably.

7. The power module according to claim 4, wherein the plurality of sidewalls further comprise:
   at least one third sidewall, wherein the third sidewall comprises a fifth connecting element and a sixth connecting element disposed on two ends thereof respectively, wherein the structure of the fifth connecting element is matching to the structures of the sixth connecting element, the second connecting elements of the first sidewalls, and the third connecting elements of the second sidewalls, and the structure of the sixth connecting element is matching to the structures of the fifth connecting element, the first connecting elements of the first sidewalls, and the fourth connecting elements of the second sidewalls; and at least one fourth sidewall, wherein the fourth sidewall comprises a seventh connecting element and an eighth connecting element disposed on two ends thereof respectively, wherein the structure of the seventh connecting element is matching to the structures of the eighth connecting element, the first connecting elements of the first sidewalls, the fourth connecting elements of the second sidewalls, and the fifth connecting element of the third sidewall, and the structure of the eighth connecting element is matching to the structures of the seventh connecting element, the second connecting elements of the first sidewalls, the third connecting elements of the second sidewalls, and the sixth connecting element of the third sidewall.

8. The powder module according to claim 7, wherein the number of the first sidewalls is at least three, the number of the second sidewalls is at least four, the number of the third sidewall is at least one and the number of the fourth sidewall is at least one, wherein the first sidewalls, the second sidewalls, the third sidewall and the fourth sidewall are assembled detachably and located around at least four sides of the substrate.

9. The power module according to claim 4, wherein the modular housing structure further comprises at least an auxiliary wall, wherein each auxiliary wall comprises two first auxiliary connecting elements and two second auxiliary connecting elements, wherein the two first auxiliary connecting elements are disposed on two ends of the auxiliary wall respectively, and the two second auxiliary connecting elements are disposed on two ends of the auxiliary wall, wherein each first sidewall comprises a third auxiliary connecting element and a fourth auxiliary connecting element disposed on two ends thereof respectively, and each second sidewall comprises a fifth auxiliary connecting element and a sixth auxiliary connecting element disposed on two ends thereof respectively, wherein the structure of the first auxiliary connecting element of the auxiliary wall is matching to the structures of the second auxiliary connecting element of the auxiliary wall and the sixth auxiliary connecting element of the second sidewall, the structure of the second auxiliary connecting element of the auxiliary wall is matching to the structures of the first auxiliary connecting element of the auxiliary wall and the fourth auxiliary connecting element of the first sidewall, and the structure of the third auxiliary connecting element of the first sidewall is matching to the structure of the fifth auxiliary connecting element of the second sidewall.

10. The power module according to claim 9, wherein the two ends of each of the auxiliary walls comprise a first end and a second end, the first auxiliary connecting element disposed on the first end of any one of the auxiliary walls is connected to the second auxiliary connecting element of another one of the auxiliary walls, the second auxiliary connecting element disposed on the first end of any one of the auxiliary walls is connected to the first auxiliary connecting element of another one of the auxiliary walls, the first auxiliary connecting element disposed on the second end of any one of the auxiliary walls is connected to the sixth auxiliary connecting element of the second wall, and the second auxiliary connecting element disposed on the second end of any one of the auxiliary walls is connected to the fourth auxiliary connecting element of the first sidewall, wherein the third auxiliary connecting element of each of the first sidewall is configured to connect with the fifth auxiliary connecting element of the second sidewall.

11. The power module according to claim 1, wherein the cover comprises two first sides opposite to each other, and at least two sidewalls of the plurality of sidewalls are integrated with the cover and disposed on the two opposite first sides of the cover.

12. The power module according to claim 1, further comprising at least a metal terminal disposed on a top surface of the substrate, wherein the cover comprises at least a through-opening, and the metal terminal is connected with the substrate and passes through the through-opening of the cover.

13. The power module according to claim 12, wherein the through-opening comprises an upper through hole, a middle through hole and a lower through hole, wherein the radius of the middle through hole is smaller than the radii of the upper through hole and the lower through hole.

14. The power module according to claim 1, wherein the sidewall comprises at least a first fastening element disposed on an upper side of the sidewall so as to fasten the cover on the upper side of the sidewall.

15. The power module according to claim 1, wherein the cover further comprises a second fastening element disposed on a top surface of the cover.

16. The power module according to claim 1, wherein the cover further comprises at least a protruding portion disposed on a lower surface of the cover and configured to contact the substrate.

17. The power module according to claim 1, wherein the sidewall comprises an extension portion having a fixing hole, and a locking piece passes through the fixing hole so as to fasten the power module on an object.

\* \* \* \* \*